US011068627B2

(12) United States Patent
Dolan et al.

(10) Patent No.: US 11,068,627 B2
(45) Date of Patent: Jul. 20, 2021

(54) PROCEDURAL WORLD GENERATION

(71) Applicant: Zoox, Inc., Foster City, CA (US)

(72) Inventors: James Graham Dolan, Foster City, CA (US); Douglas Raymond Brooks, San Mateo, CA (US)

(73) Assignee: Zoox, Inc., Foster City, CA (US)

( * ) Notice: Subject to any disclaimer, the term of this patent is extended or adjusted under 35 U.S.C. 154(b) by 0 days.

(21) Appl. No.: 16/163,478

(22) Filed: Oct. 17, 2018

(65) Prior Publication Data

US 2020/0051327 A1 Feb. 13, 2020

Related U.S. Application Data

(60) Provisional application No. 62/716,839, filed on Aug. 9, 2018.

(51) Int. Cl.
*G06F 30/20* (2020.01)
*G05D 1/00* (2006.01)
(Continued)

(52) U.S. Cl.
CPC .......... *G06F 30/20* (2020.01); *G05D 1/0088* (2013.01); *G06K 9/6212* (2013.01);
(Continued)

(58) Field of Classification Search
CPC ......... G06T 17/05; G06T 15/04; G06T 17/20; G06T 19/20; G06T 2215/16;
(Continued)

(56) References Cited

U.S. PATENT DOCUMENTS 9,135,559 B1  9/2015 Chan et al.
9,612,123 B1  4/2017 Levinson et al.
(Continued)

FOREIGN PATENT DOCUMENTS

CA  2629653 A1  11/2009
CN  107315571 A  11/2017
(Continued)

OTHER PUBLICATIONS

The PCT Invitation to Pay Additional Fees, dated Nov. 6, 2019, for PCT Application No. PCT/US2019/045805, 12 pages.
(Continued)

*Primary Examiner* — Jin Ge
(74) *Attorney, Agent, or Firm* — Lee & Hayes, P.C.

(57) ABSTRACT

Procedural generation of simulated environments is described herein. In an example, a computing device can access road network data associated with a real environment. Further, the computing device can generate, based on the sensor data, a road mesh associated with the real environment. The computing device can associate the road network data with the road mesh to generate a simulated environment and can procedurally render at least one object into the simulated environment based at least in part on at least one rule. The computing device can output the simulated environment for at least one of testing, validating, or training an algorithm used by an autonomous vehicle for at least one of navigating, planning, or decision making.

20 Claims, 11 Drawing Sheets

(51) Int. Cl.
*G06T 15/04* (2011.01)
*G06T 17/05* (2011.01)
*G06T 17/20* (2006.01)
*G06T 19/20* (2011.01)
*G06K 9/62* (2006.01)
*G06N 3/04* (2006.01)
*G06N 3/08* (2006.01)
*G01S 13/89* (2006.01)
*G01S 15/89* (2006.01)
*G01S 17/89* (2020.01)

(52) U.S. Cl.
CPC ......... *G06K 9/6215* (2013.01); *G06K 9/6262* (2013.01); *G06K 9/6269* (2013.01); *G06N 3/04* (2013.01); *G06N 3/08* (2013.01); *G06T 15/04* (2013.01); *G06T 17/05* (2013.01); *G06T 17/20* (2013.01); *G06T 19/20* (2013.01); *G01S 13/89* (2013.01); *G01S 15/89* (2013.01); *G01S 17/89* (2013.01); *G06T 2215/16* (2013.01); *G06T 2219/2004* (2013.01)

(58) Field of Classification Search
CPC .......... G06T 2219/2004; G05D 1/0088; G06F 30/20; G01S 13/89; G01S 15/89; G01S 17/89; G06K 30/20; G06K 9/6212; G06K 9/6215; G06K 9/6262; G06K 9/6269; G06N 3/04; G06N 3/08
USPC ......................................................... 345/423
See application file for complete search history.

(56) References Cited

U.S. PATENT DOCUMENTS

| | | | |
|---|---|---|---|
| 9,632,502 B1* | 4/2017 | Levinson | G01S 7/4972 |
| 9,878,155 B1 | 1/2018 | Phillips et al. | |
| 10,026,222 B1* | 7/2018 | Morrison | G06T 17/05 |
| 10,140,515 B1 | 11/2018 | Waldo | |
| 10,254,760 B1 | 4/2019 | Abeloe | |
| 10,268,191 B1 | 4/2019 | Lockwood et al. | |
| 10,545,229 B2 | 1/2020 | Rohani et al. | |
| 10,642,275 B2 | 5/2020 | Silva et al. | |
| 10,802,485 B2 | 10/2020 | Walker et al. | |
| 10,831,202 B1 | 11/2020 | Askeland et al. | |
| 2003/0014378 A1 | 1/2003 | Goodnight et al. | |
| 2003/0018277 A1 | 1/2003 | He | |
| 2008/0033645 A1* | 2/2008 | Levinson | G01C 15/00 |
| | | | 701/469 |
| 2010/0312736 A1 | 12/2010 | Kello | |
| 2013/0127852 A1* | 5/2013 | Menkov | G09B 29/007 |
| | | | 345/420 |
| 2013/0162665 A1* | 6/2013 | Lynch | G01C 21/3647 |
| | | | 345/589 |
| 2013/0179047 A1 | 7/2013 | Miller et al. | |
| 2014/0185880 A1* | 7/2014 | Fairfield | G06K 9/00825 |
| | | | 382/104 |
| 2014/0214255 A1 | 7/2014 | Dolgov et al. | |
| 2014/0225771 A1* | 8/2014 | Phuyal | G01S 17/023 |
| | | | 342/357.28 |
| 2014/0309833 A1 | 10/2014 | Ferguson et al. | |
| 2015/0057871 A1 | 2/2015 | Ono et al. | |
| 2015/0248131 A1* | 9/2015 | Fairfield | G05D 1/0044 |
| | | | 701/2 |
| 2015/0254986 A1 | 9/2015 | Fairfield et al. | |
| 2015/0262399 A1* | 9/2015 | Popescu | G06F 16/29 |
| | | | 345/630 |
| 2015/0336502 A1* | 11/2015 | Hillis | B60Q 1/26 |
| | | | 701/23 |
| 2015/0346722 A1 | 12/2015 | Herz et al. | |
| 2016/0071278 A1 | 3/2016 | Leonard et al. | |
| 2016/0189544 A1 | 6/2016 | Ricci | |
| 2017/0068861 A1 | 3/2017 | Miller et al. | |
| 2017/0139411 A1 | 5/2017 | Hartung et al. | |
| 2017/0193368 A1 | 7/2017 | Le Grand et al. | |
| 2017/0316333 A1* | 11/2017 | Levinson | G01S 17/87 |
| 2017/0329332 A1 | 11/2017 | Pilarski et al. | |
| 2017/0372431 A1 | 12/2017 | Perl et al. | |
| 2017/0372612 A1 | 12/2017 | Bai et al. | |
| 2018/0136662 A1 | 5/2018 | Kim | |
| 2018/0151077 A1 | 5/2018 | Lee | |
| 2018/0232639 A1 | 8/2018 | Lin et al. | |
| 2018/0247193 A1 | 8/2018 | Holtham | |
| 2019/0035098 A1 | 1/2019 | Pinard | |
| 2019/0204832 A1 | 7/2019 | Abeloe | |
| 2019/0235521 A1 | 8/2019 | Mudalige | |
| 2019/0238568 A1 | 8/2019 | Goswami et al. | |
| 2019/0279094 A1 | 9/2019 | Baughman et al. | |
| 2020/0027157 A1 | 1/2020 | Xu et al. | |
| 2020/0042813 A1 | 2/2020 | Nagao et al. | |
| 2020/0050716 A1 | 2/2020 | Dolan et al. | |
| 2021/0027111 A1 | 1/2021 | Taralova | |

FOREIGN PATENT DOCUMENTS

| | | |
|---|---|---|
| CN | 108932289 A | 12/2018 |
| WO | WO2017180364 | 10/2017 |
| WO | WO2019171291 A1 | 9/2019 |

OTHER PUBLICATIONS

The PCT Search Report and Written Opinion dated Dec. 3, 2019 for PCT Application No. PCT/US2019/051761, 14 pages.

Roh, et. al., "Accurate Mobile Urban Mapping via Digital Map-Based SLAM", Sensors, Jan. 18, 2016, vol. 16, No. 8, 24 pages.

The PCT Search Report and Written Opinion dated Jan. 9, 2020, for PCT Application No. PCT/US2019/045805, 14 pages.

Jeong, et al., "Adaptive Inverse Perspective Mapping for Lane Map Generation with Slam", 2016 13th International Conference on Ubiquitous Robots and Ambient Intelligence (URAI), Aug. 19, 2016, pp. 38-41.

Office Action for U.S. Appl. No. 16/163,466, dated Dec. 24, 2020, Dolan, "Procedural World Generation Using Tertiary Data", 16 Pages.

* cited by examiner

FIG. 2E

SURFACE DETAIL DATA
132

PROCEDURAL WORLD GENERATION

PRIORITY APPLICATION

This application claims priority to U.S. Provisional Patent Application No. 62/716,839, titled "Procedural World and Agent Generation," filed on Aug. 9, 2018, the entire contents of which are incorporated by reference herein.

BACKGROUND

Simulated-world environments ("simulated environments") comprise renderings of various environments. Such renderings may include, for example, roads, vehicles, pedestrians, and the like. Simulated environments can be useful for enhancing training, testing, and/or validating systems. Existing techniques for generating simulated environments require manual generation, which is both computationally intensive and time consuming.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 2A-2F illustrate non-limiting examples of various aspects of procedural rendering of a simulated environment, as described herein.

DETAILED DESCRIPTION

Figure 1:
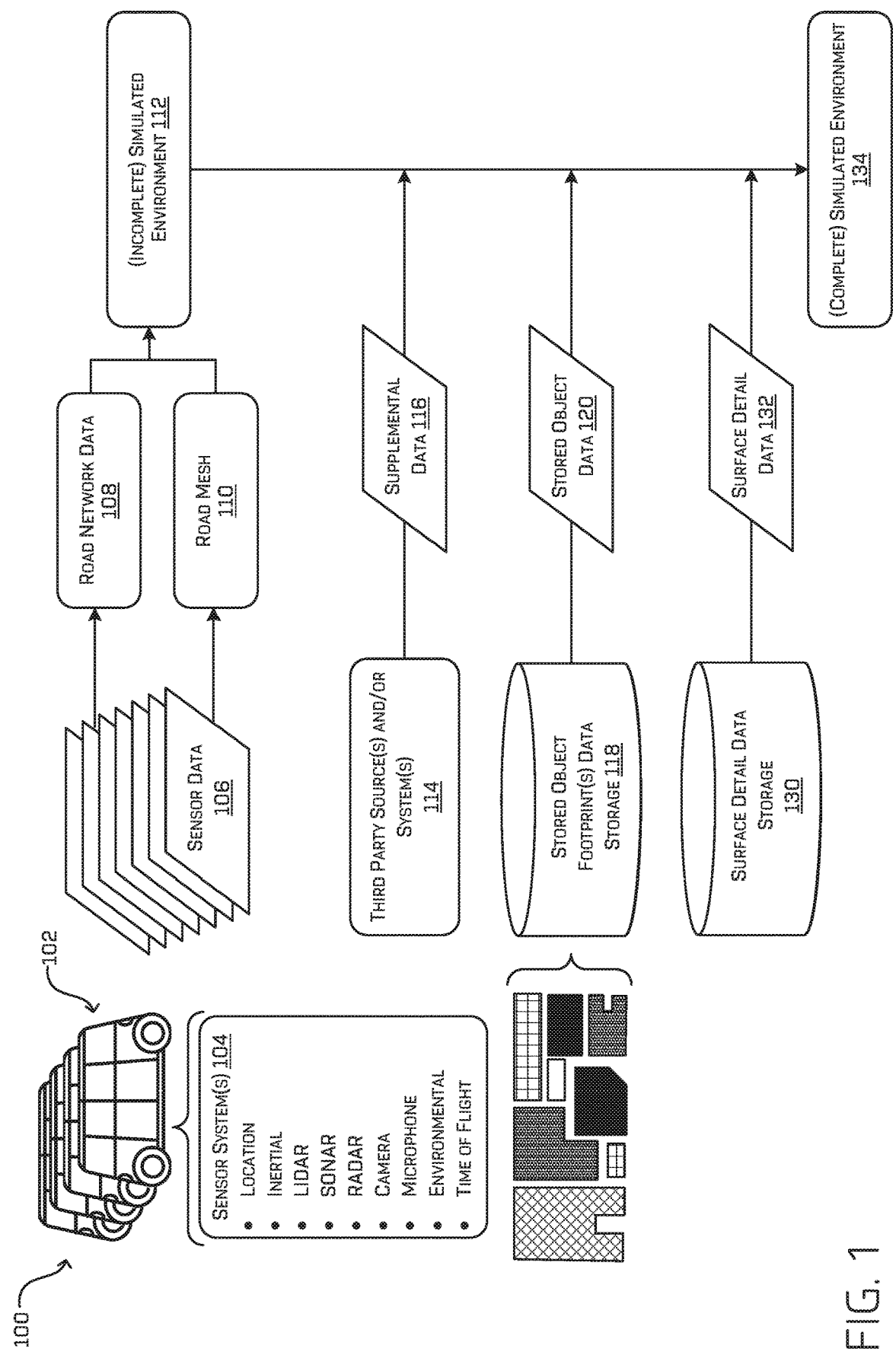
FIG. 1 illustrates an example of procedurally rendering a simulated environment, as described herein.

Techniques described herein are directed to various aspects of procedural world generation. That is, techniques described herein are directed to procedurally generating simulated worlds for use with testing, validating, or training systems and/or components used by vehicles for navigating, planning, and/or decision making. In at least some examples described herein, such generated simulated worlds may be generated to represent real world environments, and at least in some examples, as accurate as possible. Techniques described herein describe how such simulated environments may be generated.

In an example, techniques described herein are directed to receiving sensor data from various sensor systems in a real environment. The sensor systems can include, but are not limited to, light detection and ranging (LIDAR) sensors, radio detection and ranging (RADAR) sensors, ultrasonic transducers, sound navigation and ranging (SONAR) sensors, Time of Flight (ToF) sensors, location sensors (e.g., global positioning system (GPS), compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), etc. Using the sensor data, techniques described herein can generate, receive, and/or otherwise access road network data associated with the real environment and a road mesh associated with the real environment. Techniques described herein can associate the road network data with the road mesh to generate a simulated environment. That is, data representative of a real environment can be used to generate a simulated environment. In some examples, the simulated environment can be supplemented with tertiary data (e.g., data from a third-party), which can be referred to herein as "supplemental data." Techniques descried herein are further directed to procedurally rendering object(s) and surface details into the simulated environment. The resulting simulated environment can be used for testing, validating, and/or training systems and/or components used by an autonomous robotic computing device, such as an autonomous vehicle, for navigating, planning, and/or decision making.

Simulated environments can be useful for enhancing training, testing, and/or validating systems (e.g., one or more components of an artificial intelligent (AI) stack) onboard an autonomous vehicle. For instance, in at least one example, simulated environments can be useful for training systems that are to be used onboard an autonomous vehicle (e.g., models used by such systems), for instance when real data is not readily available, when testing would be unsafe in a real environment, and in order to generate magnitudes more data than would otherwise be available. In at least one example, simulated environments can be used for generating training data for rare or infrequently occurring scenarios and/or objects. Moreover, simulated environments can be useful for testing performance of an autonomous vehicle (e.g., models and/or systems running thereon), for instance, when real environments are either not available or are not safe, or a ground truth is not otherwise available. Furthermore, in some examples, sensor data associated with simulated environments can be more accurate than sensor data associated real environments (e.g., due to occlusions, noise, drift, etc.) and as such, simulated environments can be used for validating observations made in association with real environments. In some examples, simulated environments can be used for calibration (e.g., of one or more sensor systems onboard an autonomous vehicle). Techniques described herein are directed to generating simulated environments and using simulated environments in various scenarios, as described above.

Techniques described herein offer various computational efficiencies. For instance, by utilizing procedural rendering techniques described herein, computing devices require fewer computational resources and simulated worlds can be generated faster than what is available via conventional techniques. Conventional techniques are not scalable. For instance, generating a simulated environment for a new geographical location can take days, or even months, using conventional techniques. Generating tens, hundreds, and thousands of new simulated environments—as many as are needed for training, testing, and/or validating systems (e.g., one or more components of an AI stack) onboard an autonomous vehicle (e.g., prior to such autonomous vehicle(s) being deployed in corresponding new real environments)—would take months, or even years, thereby limiting the ability to train, test, and/or validate such systems (e.g., one or more components of an AI stack) onboard an autonomous vehicle prior to entering into new real environments. Techniques described herein are unconventional in that they leverage sensor data collected from real environments and supplement that data with tertiary data to generate a substantially accurate simulated environment (e.g., relative to the corresponding real environment) more efficiently than what is available with conventional techniques. Further, techniques described herein—such as customizing the look of a simulated environment by randomizing and/or parameterizing the addition of object and/or surface details—enable the generation of large, scalable simulated environments in less time and with fewer computational resources than what is available with conventional techniques.

Furthermore, techniques described herein are directed to improvements in safety. That is, simulated environments resulting from generation techniques described herein can be used for testing, training, and validating systems onboard an autonomous vehicle to ensure such systems can operate autonomous vehicles safely when deployed in real environments. That is, simulated environments resulting from generation techniques described herein can be used for testing, training, and validating a planner system, which can be used by an autonomous vehicle to navigate the autonomous vehicle along a trajectory in a real environment. Thus, such training, testing, and validating enabled by techniques described herein can provide opportunities to ensure that autonomous vehicles can operate in real world environments safely. As such, techniques described herein improve safety and impact navigation.

FIG. 1 illustrates a schematic diagram 100 representing procedural world generation as described herein. In an example, one or more computing devices can procedurally render a simulated environment, as described herein.

In at least one example, data collection devices 102 can utilize sensor system(s) 104 to collect sensor data 106 associated with a real environment. As described above, the sensor system(s) 104 can include, but are not limited to, LIDAR sensors, RADAR sensors, ultrasonic transducers, SONAR sensors, ToF sensors, location sensors (e.g., GPS, compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), etc. The sensor system(s) 104 can output the sensor data 106, which can be received by the computing device(s). In some examples, the data collection devices 102 can be autonomous vehicles that traverse the real environment, as illustrated in FIG. 1. However, the data collection devices 102 can be any computing device that is capable of collecting sensor data 106 in a real environment.

The computing device(s) can receive, generate, and/or otherwise access road network data 108 and/or a road mesh 110, which can be based at least in part on the sensor data 106. In at least one example, the road network data 108 may, for example, be a two-dimensional (2D) or a three-dimensional (3D) representation indicating one or more of a driving lane element, a bike lane element, a parking lane element, a crosswalk element, an intersection element, a lane divider element, a traffic light element, a stop sign element, a stop line element, a yield sign element, a yield line element, a driveway element, a speed bump element, jay walking regions (e.g., a virtual crosswalk), trajectory waypoints (e.g., known trajectories), passenger pickup points, a sign location element, a geofence element, and the like. In some examples, the road network data 108 can be encoded with information indicating an attribute of a particular portion of the road network data. For instance, a road line in the road network data 108 can be encoded with information indicating that the road line is associated with a bike lane element, a parking lane element, or a crosswalk element.

The road mesh 110 can comprise 3D tiles (which can be output by a localization system, as described below). Additional details associated with such road network data 108 and/or the road mesh 110 are described in U.S. patent application Ser. No. 15/927,806, filed on Mar. 21, 2018 and U.S. patent application Ser. No. 15/913,647, filed on Mar. 6, 2018, the entire contents of both of which are incorporated by reference herein. The computing device(s) can associate the road network data 108 with the road mesh 110 to generate a simulated environment 112. Such an integration may comprise, in at least some instances, projecting the road network data 108 (as 2D or 3D data) into the road mesh 110. That is, techniques described herein are directed to generating a simulated environment (e.g., the simulated environment 112) based on real-world data (e.g., the sensor data 106).

The resulting simulated environment 112 can include accurate heights and surface details (e.g., in view of a corresponding real environment). However, in some examples, there may be holes in the simulated environment (e.g., incomplete data), for instance, due to occlusions (e.g., parked cars, tight alleyways, etc.) when constructing the road mesh 110. In at least one example, the computing device(s) can access a second, alternate source of data to supplement the existing simulated environment (e.g., and fill in the holes). For instance, in at least one example, the computing device(s) can access data from third-party source(s) and/or system(s) 114 and can leverage such supplemental data 116 to supplement the existing simulated environment 112. The supplemental data 116 can go beyond the current data set (e.g., road network data 108 and road mesh 110), such that the supplemental data 116 provides information associated with the real environment that is not otherwise available to the data collection device(s) 102 due to occlusion(s) and/or other deficiencies associated with the data collection techniques. In at least one example, the supplemental data 116 can include U.S. Geological Survey (USGS) Data Evaluation Model (DEM) data, etc. The USGS DEM data can comprise a dataset with raster elevation data (e.g., a digital elevation map). The USGS DEM data may not be as accurate as the associated data (e.g., the road network data and the road mesh); however, the USGS DEM data is often more complete. That is, the USGS DEM data may not have holes and thus, such data can be used to supplement data sets that are missing data (e.g., due to occlusions or other deficiencies in data collection). In an additional or alternative example, the supplemental data 116 can include tree map data associated with a real environment, color imagery data associated with a real environment, map data associated with an environment, etc.

Furthermore, the computing device(s) can leverage data associated with characteristics of objects in the environment to further supplement the simulated environment 112. In at least one example, the computing device(s) can access a stored object footprint(s) data storage 118, which stores stored object data 120 representative of footprints of buildings or other stationary objects. In some examples, such footprints can be associated with annotations regarding height, classification (e.g., residential, commercial, etc.), etc. The computing device(s) can utilize the footprints and associated annotations (e.g., stored object data 120) as a guide mesh for generating façade pieces and rule sets. For instance, in an example, the computing device(s) can associate rule sets with individual stored object footprints. The rule sets can indicate what surface details and/or textures to associate with various portions of an object. Such rule sets can be associated with the individual stored object footprints randomly or based on one or more parameters (e.g., height, classification, etc.). Such rule sets can indicate how to generate façade pieces for the objects corresponding to the stored object footprints. For instance, a rule set can include references to textures that can be used to generate façade pieces. As a non-limiting example, a rule set may indicate using a particular mesh, texture, etc. for a first floor of a commercial office building (e.g., the building classification), a different mesh, texture, etc. for second (and subsequent) floor of such a building, etc. As such, execution of a rule set can add surface details (e.g., a façade) to an object in the simulated environment. The addition of such details enables realistic-looking simulated environments to be procedurally generated. For instance, façade details can affect shadow casting and/or reflections of windows, which can add complexity to the simulated environment so that it represents real-world conditions.

In at least one example, the building footprints, heights, texturing, and classifications may be randomly defined. In those examples where data associated with such footprints does not have an indication of positioning within a map (e.g., where footprints are randomly determined, retrieved from a data storage of footprints agnostic to a map, etc.), such footprints may be aligned with, or otherwise positioned, such that at least one façade aligns with a street in a road network, is spaced according to one or more rules (e.g., placed a certain distance to a street and, based on the classification, a minimum or maximum distance from other buildings, is orientated in a particular orientation, etc.), and the like. When such rule sets are applied, plausible looking buildings can be generated automatically (e.g., without human modeling) in the simulated environment 112. Utilizing such rules enables the procedural generation of different-looking simulated environments without a significant investment in designer time and/or computational resources. That is, utilizing such rules increases the efficiency with which complex simulated environments can be generated (e.g., via relatively straightforward rules).

In some examples, the computing device(s) can utilize texturing data to add surface detail to the simulated environment 112, for instance, during real-time rendering. In such examples, the computing device(s) can access a surface detail data storage 122, which stores surface detail data 106. The surface detail data 106, which can also be called "texturing data," can comprise details (e.g., defects, patches, markings, etc.) which can be added to objects in the simulated environment 112 to make such objects appear unique (without increasing artist workload significantly or otherwise requiring additional compute for customizing algorithmically). In at least one example, the computing device(s) can utilize sparse virtual textures to render the simulated environment 112 in a single draw which increases performances and reduces computational resources. In such an example, each surfel (e.g., surface element) may be associated with unique data (such as an identification), such that the individual surfels may be allocated, addressed, and assigned. Furthermore, in some examples, the computing device(s) can add a plurality of brush-stroke-like decals on each surface of an object to be rendered in the simulated environment 112. In at least some examples, various decals may be applied for various regions and classifications of structures (e.g., photorealistic dirt and grime, graffiti, garbage, etc. may be applied to, for example, building façades in an alleyway) so as to modify any procedural based texturing (e.g., applying a pattern of textures over a surface given an associated classification). Techniques described herein enable designers to model a few different textures, which can be used throughout the simulated environment 112. Adding surface detail to the simulated environment 112 can increase diversity within the simulated environment 112 and between the simulated environment 112 and other simulated environments.

A resulting simulated environment 134 can be output for use by a simulation computing system. In at least one example, the simulated environment 134 can be useful for enhancing training, testing, and/or validating systems (e.g., one or more components of an AI stack) onboard an autonomous vehicle. For instance, in at least one example, the simulated environment 134 can be useful for training systems that are to be used onboard an autonomous vehicle (e.g., models used by such systems), for instance when real data is not readily available, when testing would be unsafe in a real environment, and in order to generate magnitudes more data than would otherwise be available. In at least one example, the simulated environment 134 can be used for generating training data for rare or infrequently occurring scenarios and/or objects. Moreover, the simulated environment 134 can be useful for testing performance of an autonomous vehicle (e.g., models and/or systems running thereon), for instance, when real environments are either not available or are not safe, or a ground truth is not otherwise available. By having a simulated environment, exact ground truth measurements can be determined for such validations without the need for human based annotations of data. Furthermore, in some examples, sensor data associated with the simulated environment 134 can be more accurate than sensor data associated real environments (e.g., due to occlusions, noise, drift, etc.) and as such, the simulated environment 134 can be used for validating observations made in association with real environments. In some examples, the simulated environment 134 can be used for calibration (e.g., of one or more sensor systems onboard an autonomous vehicle).

FIGS. 2A-2F illustrate non-limiting examples of various aspects of procedural rendering of a simulated environment, as described herein.

Figure 2A:
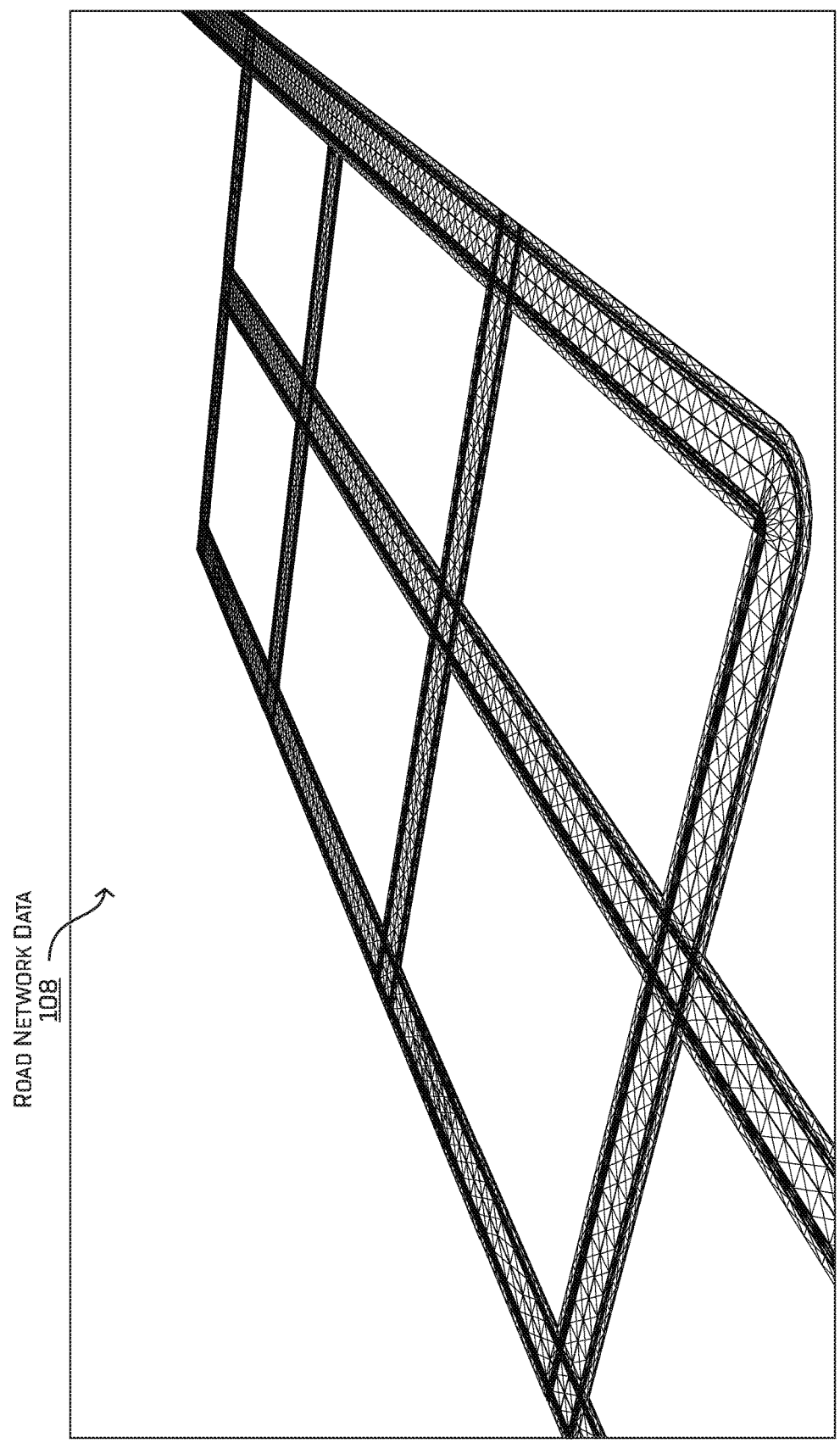
Figure 2B:
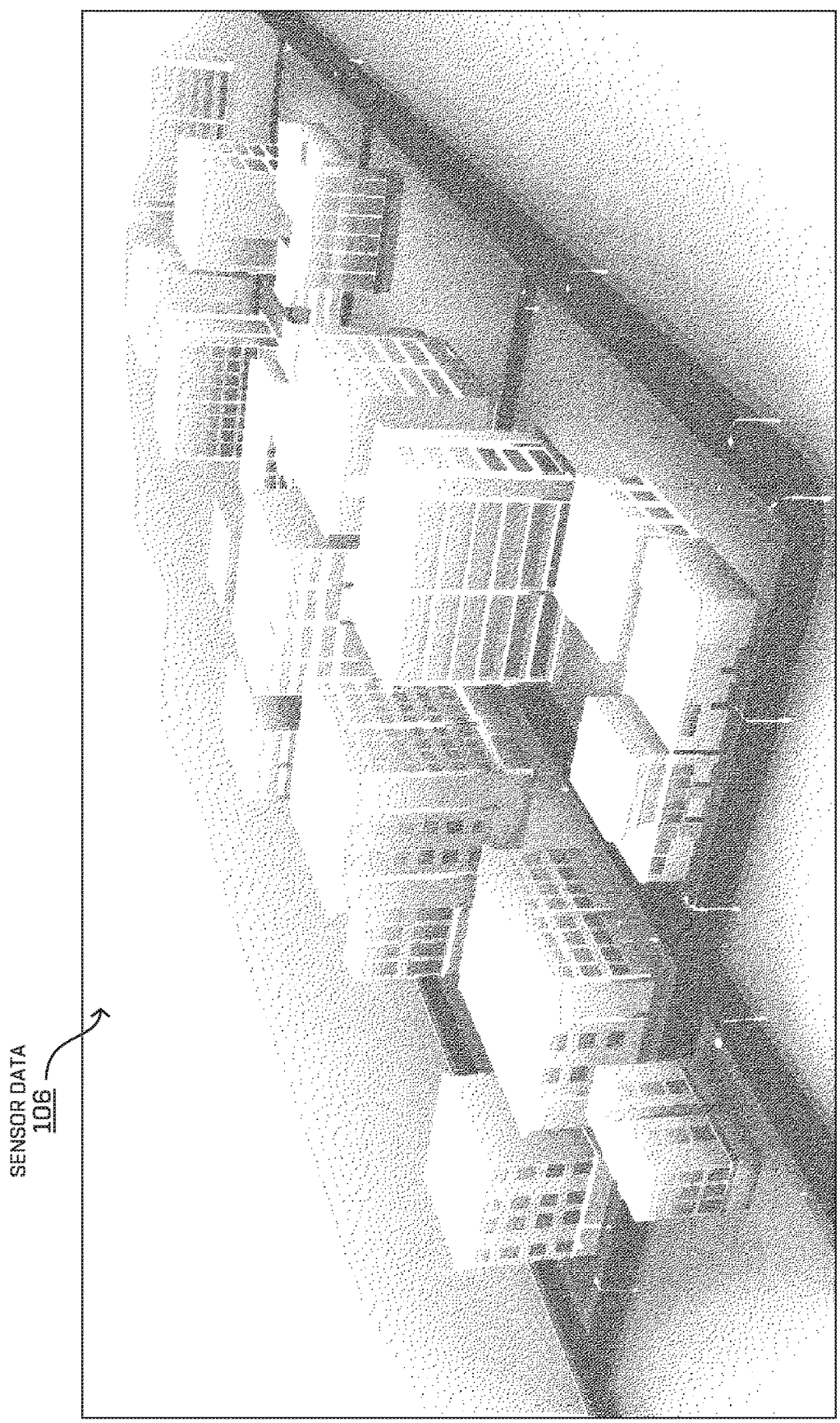

As described above, data collection device(s) 102 can generate sensor data 106 associated with a real environment via sensor system(s) 104. Computing device(s) can receive the sensor data 106 and receive, generate, and/or otherwise access road network data 108, as illustrated in FIG. 2A. In at least one example, the road network data 108 may, for example, be a 2D or a 3D representation of the real environment (or a portion thereof) indicating one or more of a driving lane element, a bike lane element, a parking lane element, a crosswalk element, an intersection element, a lane divider element, a traffic light element, a stop sign element, a stop line element, a yield sign element, a yield line element, a driveway element, a speed bump element, jay walking regions (e.g., a virtual crosswalk), trajectory waypoints (e.g., known trajectories), passenger pickup points, a sign location element, a geofence element, and the like. Additionally, the computing device(s) can generate a road mesh 110. In at least one example, the sensor data 106 can comprise LIDAR data, which can be used to generate a 3D point cloud representative of the real environment, as illustrated in FIG. 2B. In at least one example, the computing device(s) can generate the road mesh 110 based on the 3D point cloud. The road mesh 110 can comprise 3D tiles (which can be output by a localization system, as described below). The computing device(s) can associate the road network data 108 with the road mesh 110 to generate a simulated environment 112. Such an integration may comprise, in at least some instances, projecting the road network data 108 (as 2D or 3D data) onto the road mesh 110.

Figure 2C:
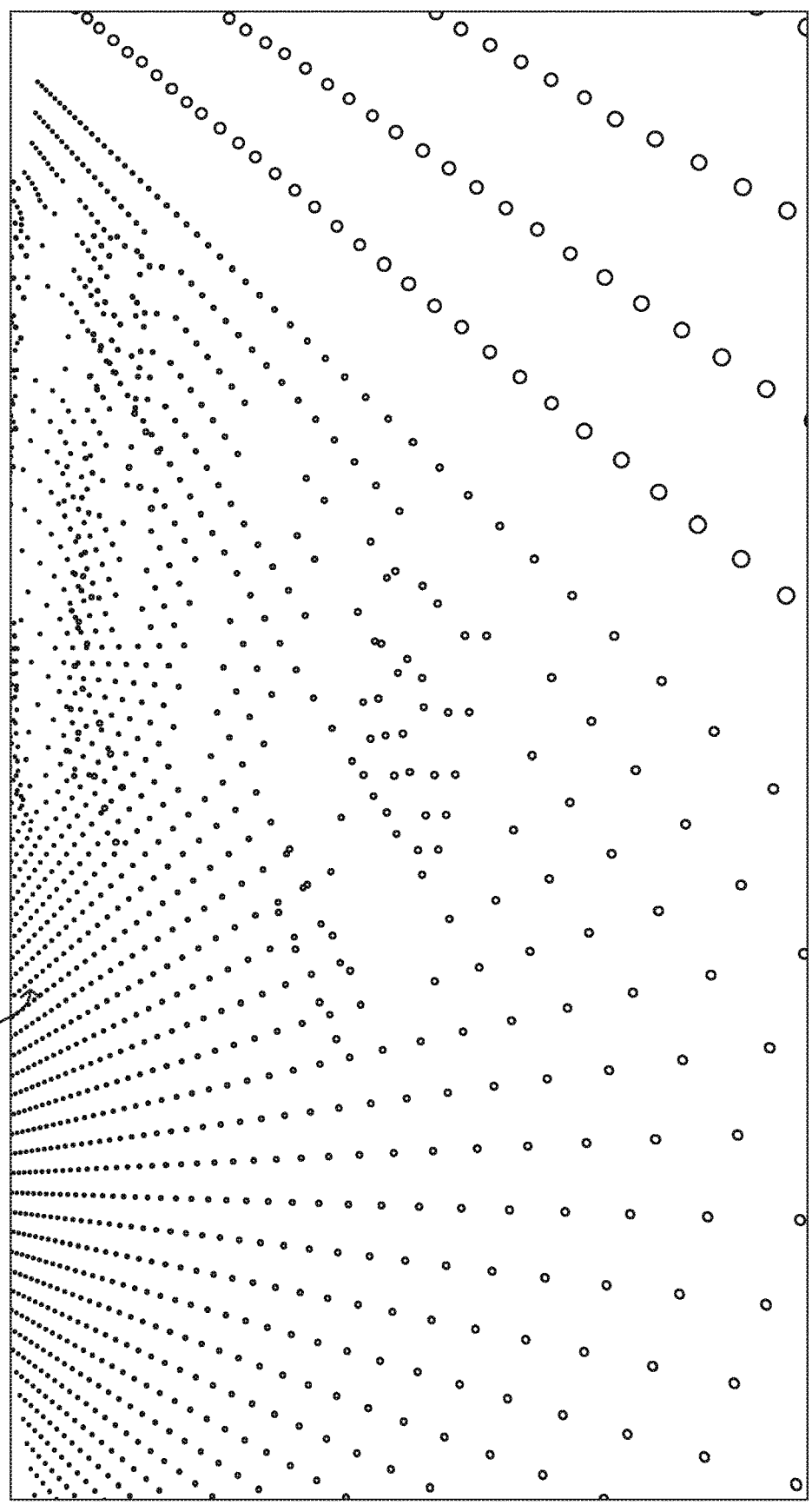

As described above, the resulting simulated environment 112 can include accurate heights and surface details (e.g., in view of a corresponding real environment). However, in some examples, there may be holes in the simulated environment (e.g., incomplete data), for instance, due to occlusions (e.g., parked cars, tight alleyways, etc.) when constructing the road mesh 110. In at least one example, the computing device(s) can access a second, alternate source of data to supplement the existing simulated environment (e.g., and fill in the holes). FIG. 2C illustrates a non-limiting example of supplemental data 116 corresponding to the same portion of the real environment as is represented in FIGS. 2A and 2B. For instance, in at least one example, the computing device(s) can access data from third-party source(s) and/or system(s) 114 and can leverage such supplemental data 116 to supplement the existing simulated environment 112 (e.g., by integrating the road network data 108 and/or road mesh 110 with the supplemental data 116). As described above, the supplemental data 116 can include USGS DEM data associated with a real environment, tree map data associated with a real environment, color imagery data associated with a real environment, map data associated with an environment, etc.

Figure 2D:
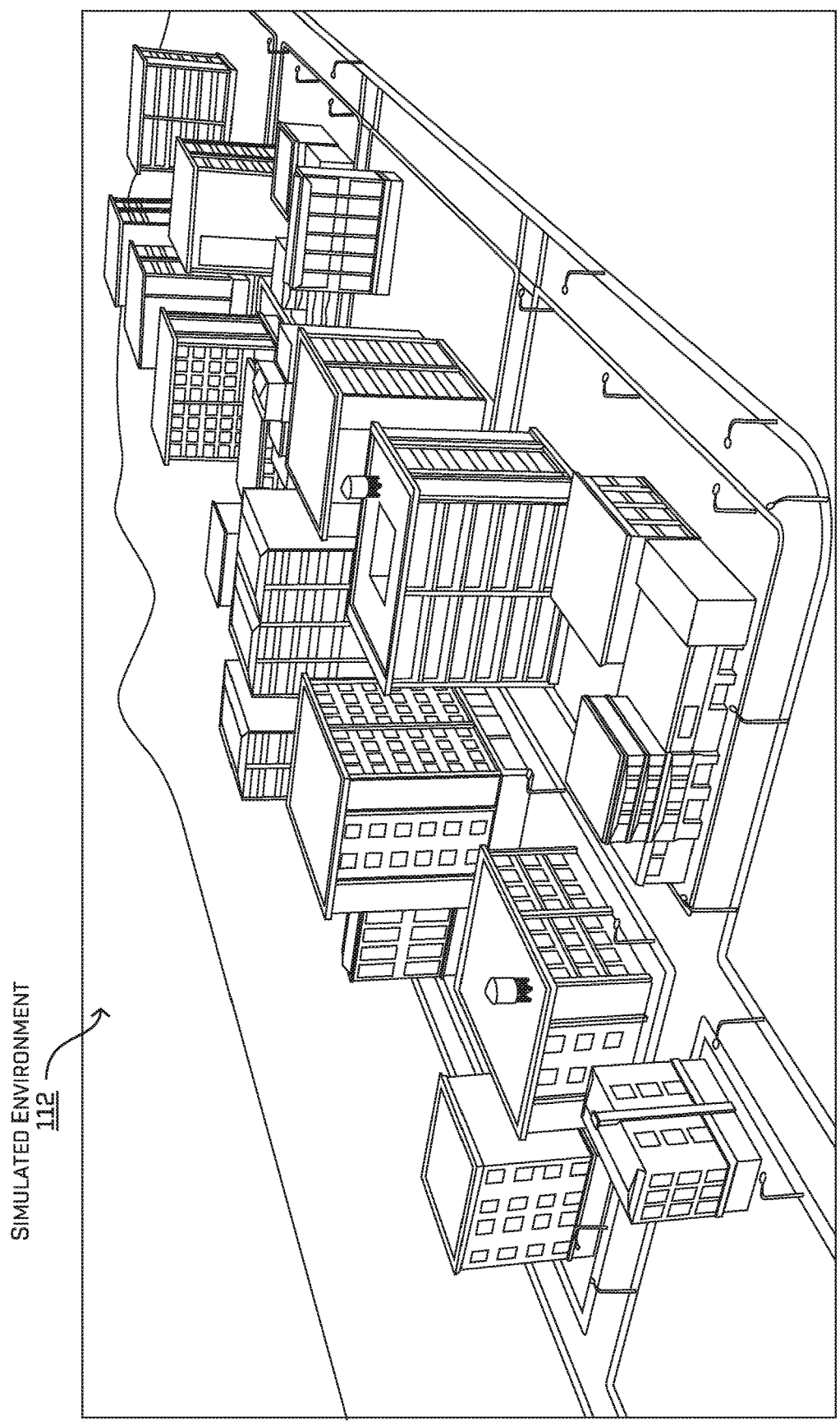

Furthermore, the computing device(s) can leverage data associated with characteristics of objects in the environment to further supplement the simulated environment 112. In at least one example, the computing device(s) can access a stored object footprint(s) data storage 118, which stores stored object data 120 representative of footprints of buildings or other stationary objects. In some examples, such footprints can be associated with annotations regarding height, classification (e.g., residential, commercial, etc.), rule sets, etc. The computing device(s) can utilize the footprints and associated annotations (e.g., stored object data 120) as a guide mesh for generating façade pieces, as described above. In at least one example, the building footprints, heights, texturing, rule sets, and/or classification may be randomly defined. In those examples where data associated with such footprints does not have an indication of positioning within a map (e.g., where footprints are randomly determined, retrieved from a data storage of footprints agnostic to a map, etc.), such footprints may be aligned with, or otherwise positioned, such that at least one façade aligns with a street in a road network, is spaced according to one or more rules (e.g., placed a certain distance to a street and, based on the classification, a minimum or maximum distance from other buildings, is orientated in a particular orientation, etc.), is orientated based on one or more rules, and the like. When such rule sets are applied, plausible looking buildings can be generated automatically in the simulated environment 112, as illustrated in FIG. 2D.

Figure 2E:
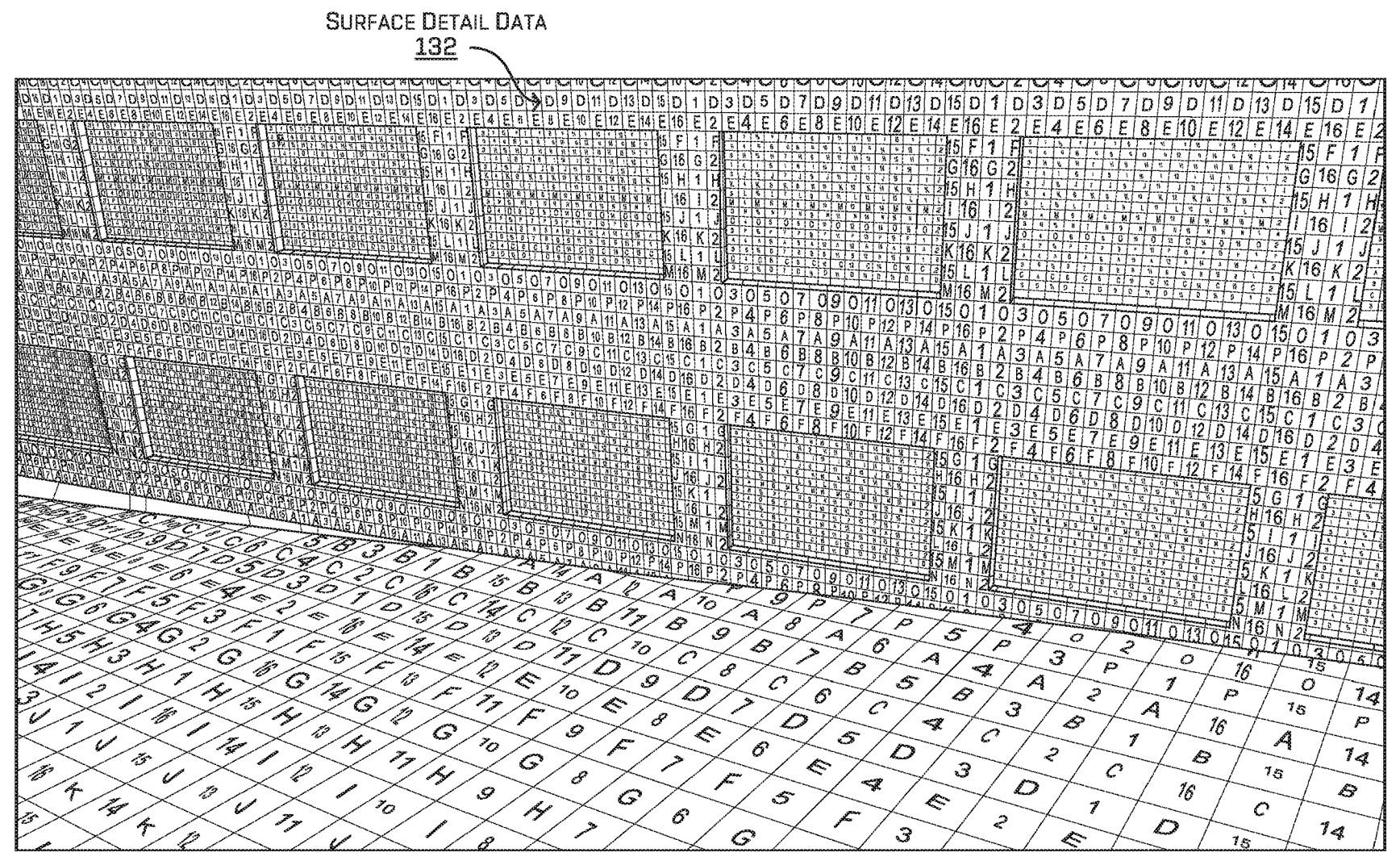

In some examples, the computing device(s) can utilize texturing data to add surface detail to the simulated environment 112, for instance, during real-time rendering. In such examples, the computing device(s) can access a surface detail data storage 130 which stores surface detail data 132. The surface detail data 132, which can also be called "texturing data," can comprise details (e.g., defects, patches, markings, etc.) which can be added to objects in the simulated environment 112 to make such objects appear unique (without increasing artist workload significantly). In at least one example, the computing device(s) can utilize sparse virtual textures, as illustrated in FIG. 2E, to render the simulated environment 112 in a single draw which increases performances and reduces computational resources. In such an example, each surfel may be associated with unique data (such as an identification), such that the individual surfels may be allocated, addressed, and assigned. Though depicted as single alphanumeric characters for illustrative purposes in FIG. 2E, such identifications are not meant to be so limiting. Furthermore, in some examples, the computing device(s) can add a plurality of brush-stroke-like decals on each surface of an object to be rendered in the simulated environment 112. In at least some examples, various decals may be applied for various regions and classifications of structures (e.g., photorealistic dirt and grime, graffiti, garbage, etc. may be applied to, for example, building façades in an alleyway) so as to modify any procedural based texturing (e.g., applying a pattern of textures over a surface given an associated classification).

Figure 2F:
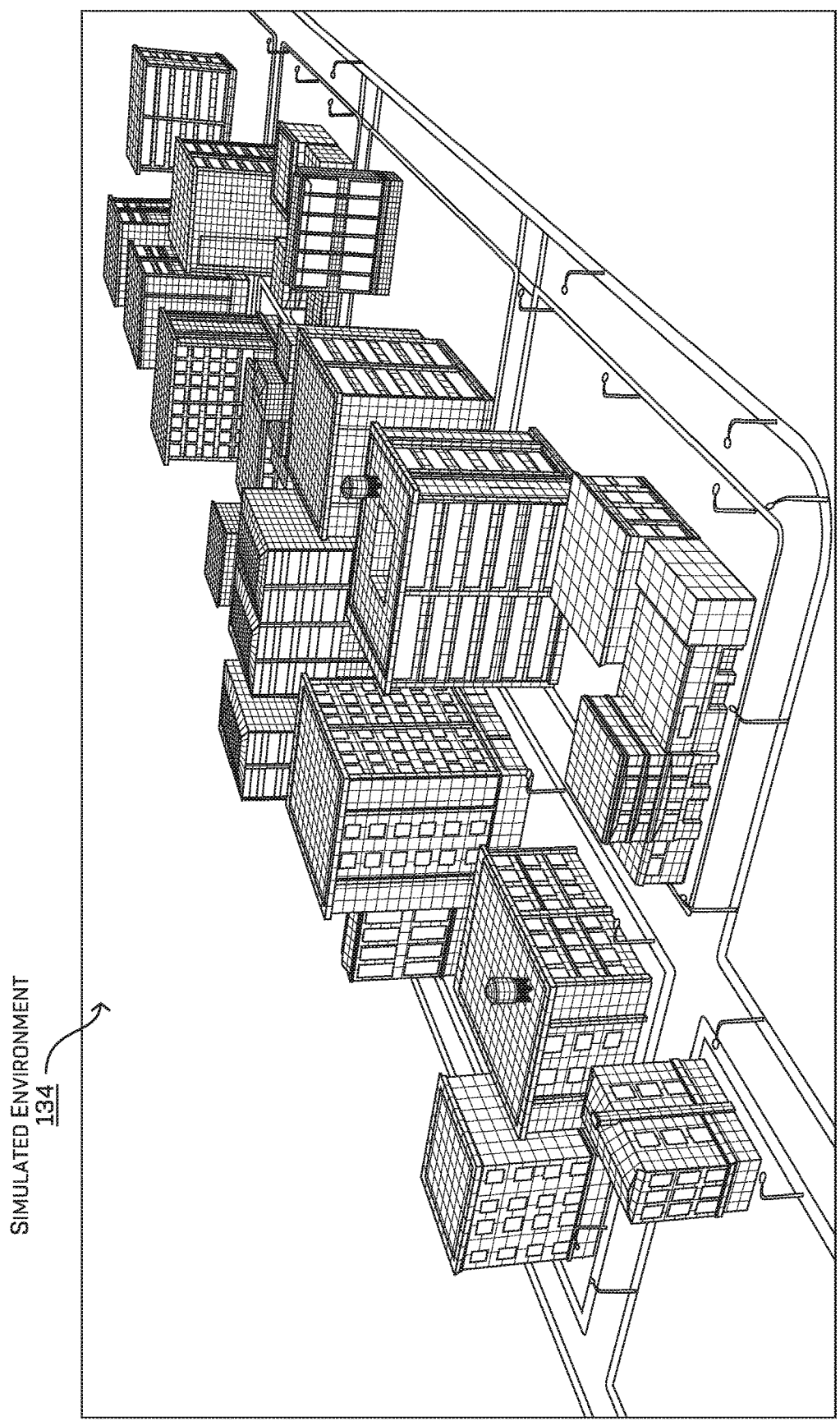

FIG. 2F illustrates a non-limiting example of the resulting simulated environment 134, which can be for enhancing training, testing, and/or validating systems (e.g., one or more components of an AI stack) onboard an autonomous vehicle, as described herein. That is, in some examples, the resulting simulated environment 134 can be used for training, testing, and/or validating algorithm(s) used by onboard systems of an autonomous vehicle, which can be used by the autonomous vehicle to control the autonomous vehicle.

Figure 3:
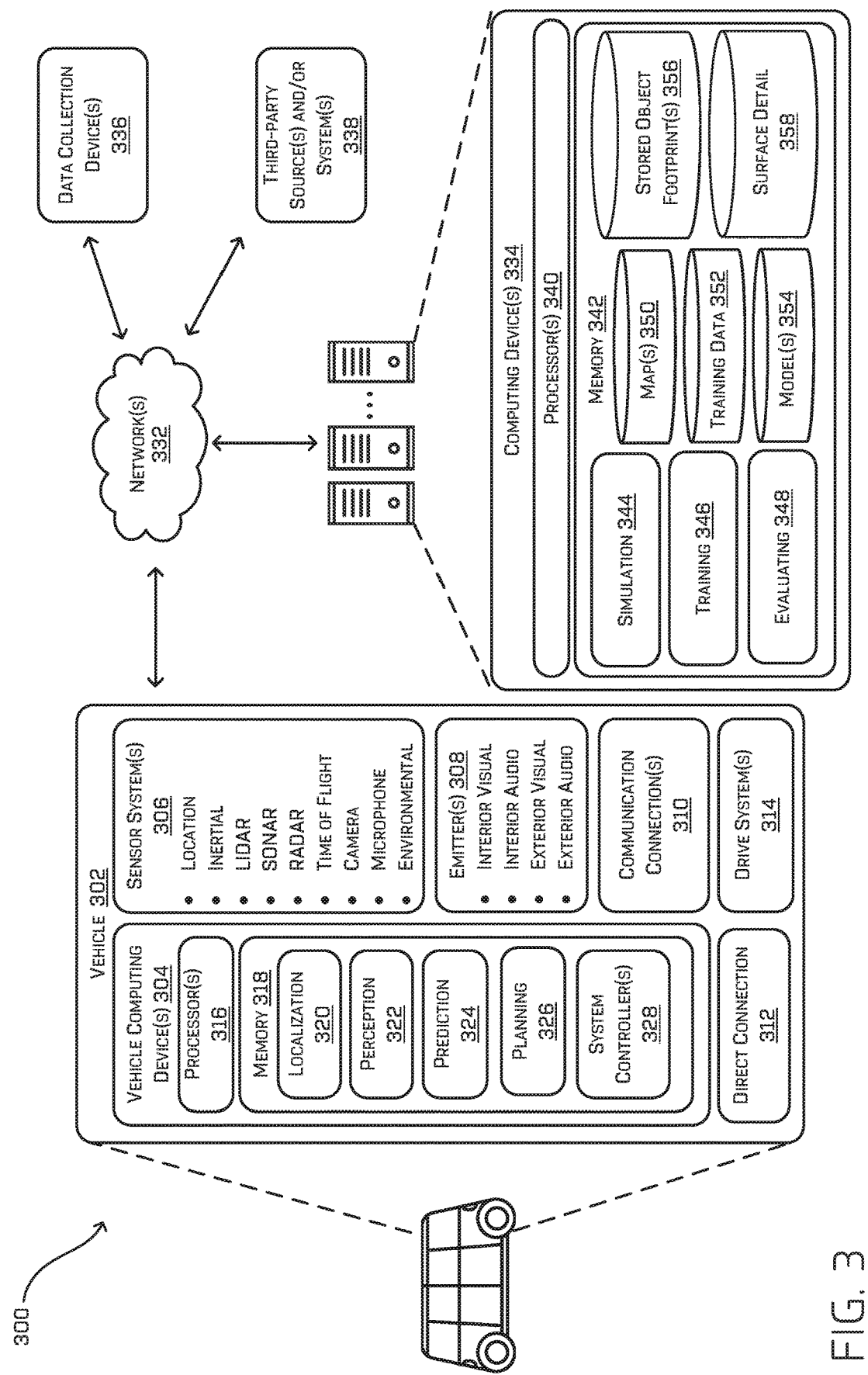
FIG. 3 is a block diagram illustrating an example system for procedurally rendering a simulated environment, as described herein.

FIG. 3 is a block diagram illustrating an example system 300 for procedurally rendering a simulated environment.

In at least one example, a vehicle 302 can include one or more vehicle computing devices 304, one or more sensor systems 306, one or more emitters 308, one or more communication connections 310, at least one direct connection 312, and one or more drive systems 314. For the purpose of illustration, the vehicle 302 can be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such an example, since the vehicle 302 can be configured to control all functions from start to stop, including all parking functions, it can be unoccupied. This is merely an example, and the systems and methods described herein can be incorporated into any ground-borne, airborne, or waterborne vehicle, including those ranging from vehicles that need to be manually controlled by a driver at all times, to those that are partially or fully autonomously controlled. That is, in the illustrated example, the vehicle 302 is an autonomous vehicle; however, the vehicle 302 could be any other type of vehicle.

In at least one example, the vehicle 302 can be a data collection device (e.g., of the data collection device(s) 102). In an additional or alternative example, the one or more components of the AI stack described above can be associated with the vehicle 302. That is, the simulated environment described herein can be used to train, test, and/or validate one or more of the components described below with reference to vehicle 302.

The vehicle computing device(s) 304 can include processor(s) 316 and memory 318 communicatively coupled with the processor(s) 316. In the illustrated example, the memory 318 of the vehicle computing device(s) 304 stores a localization system 320, a perception system 322, a prediction system 324, a planning system 326, and one or more system controllers 328. Additionally, the memory 318 can include a storage 230, which can store map(s), model(s), etc. A map can be any number of data structures modeled in two dimensions, three dimensions, or N dimensions that are capable of providing information about an environment, such as, but not limited to, topologies (such as intersections), streets, mountain ranges, roads, terrain, and the environment in general. Maps can be associated with real environments or simulated environments. Model(s) can include machine-trained models, as described below.

In at least one example, the localization system 320 can determine a pose (e.g., a position and an orientation) of the vehicle 302 in relation to a local and/or global map based at least in part on sensor data received from the sensor system(s) 306 and/or map data associated with a map (e.g., of the map(s)). In at least one example, the localization system 320 can include, or be associated with a calibration system that is capable of performing operations for calibrating (determining various intrinsic and extrinsic parameters associated with any one or more of the sensor system(s) 306), localizing, and mapping substantially simultaneously. Additional details associated with such a system are described in U.S. patent application Ser. No. 15/675,487, filed on Aug. 11, 2017, which is related to U.S. patent application Ser. No. 15/674,853, filed on Aug. 11, 2017, the entire contents of both of which are incorporated by reference herein. As described above, the localization system 320 can output road network data and/or a road mesh based on the sensor data received by the sensor system(s) 306.

In at least one example, the perception system 322 can perform object detection, segmentation, and/or classification based at least in part on sensor data received from the sensor system(s) 306. In at least one example, the perception system 322 can receive raw sensor data (e.g., from the sensor system(s) 306). In other examples, the perception system 322 can receive processed sensor data (e.g., from the sensor system(s) 306). For instance, in at least one example, the perception system 322 can receive data from a vision system that receives and processes camera data (e.g., images). In at least one example, the vision system can utilize one or more image processing algorithms to perform object detection, segmentation, and/or classification with respect to object(s) identified in an image. In some examples, the vision system can associate a bounding box (or other semantic information, such as an instance segmentation) with an identified object and can associate a confidence score associated with a classification of the identified object. In some examples, objects, when rendered via a display, can be colored based on their perceived class. In at least other examples, similar processes (detection, classification, segmentation, etc.) may be performed by the perception system 322 for one or more other modalities (e.g., LIDAR, RADAR, ToF sensors, etc.).

The prediction system 324 can access sensor data from the sensor system(s) 306, map data associated with a map (e.g., of the map(s) which can be in storage 230), and/or perception data output from the perception system 322 (e.g., processed sensor data), and can output predictions associated with one or more objects within the environment of the vehicle 302. In at least one example, the planning system 326 can determine routes and/or trajectories to use to control the vehicle 302 based at least in part on sensor data received from the sensor system(s) 306 and/or any determinations made by the perception system 322. Additional details of localizer systems, perception systems, prediction systems, and/or planning systems that are usable can be found in U.S. Pat. No. 9,612,123, issued on Apr. 4, 2017, and U.S. patent application Ser. No. 15/632,208, filed Jun. 23, 2017, the entire contents of both of which are incorporated by reference herein. In some examples (e.g., where the vehicle 302 is not an autonomous vehicle), one or more of the aforementioned systems and/or components can be omitted from the vehicle 302. While the systems described above are illustrated as "onboard" the vehicle 302, in other implementations, the systems can be remotely located and/or accessible to the vehicle 302.

In at least one example, the localization system 320, the perception system 322, the prediction system 324, and/or the planning system 326 can process sensor data, as described above, and can send their respective outputs over network(s) 332, to computing device(s) 334. In at least one example, the localization system 320, the perception system 322, the prediction system 324, and/or the planning system 326 can send their respective outputs to the computing device(s) 334 at a particular frequency, after a lapse of a predetermined period of time, in near real-time, etc.

In at least one example, the vehicle computing device(s) 304 can include one or more system controllers 328, which can be configured to control steering, propulsion, braking, safety, emitters, communication, and other systems of the vehicle 302. These system controller(s) 328 can communicate with and/or control corresponding systems of the drive system(s) 314 and/or other components of the vehicle 302.

In at least one example, the sensor system(s) 306, which can correspond to sensor system(s) 104, can include LIDAR sensors, RADAR sensors, ToF sensors, ultrasonic transducers, SONAR sensors, location sensors (e.g., GPS, compass, etc.), inertial sensors (e.g., inertial measurement units, accelerometers, magnetometers, gyroscopes, etc.), cameras (e.g., RGB, IR, intensity, depth, etc.), microphones, wheel encoders, environment sensors (e.g., temperature sensors, humidity sensors, light sensors, pressure sensors, etc.), etc. The sensor system(s) 306 can include multiple instances of each of these or other types of sensors. For instance, the LIDAR sensors can include individual LIDAR sensors located at the corners, front, back, sides, and/or top of the vehicle 302. As another example, the camera sensors can include multiple cameras disposed at various locations about the exterior and/or interior of the vehicle 302. The sensor system(s) 306 can provide input to the vehicle computing device(s) 304. In some examples, the sensor system(s) 306 can preprocess at least some of the sensor data prior to sending the sensor data to the vehicle computing device(s) 304. In at least one example, the sensor system(s) 306 can send sensor data, via the network(s) 332, to the computing device(s) 334 at a particular frequency, after a lapse of a predetermined period of time, in near real-time, etc.

The vehicle 302 can also include one or more emitters 308 for emitting light and/or sound, as described above. The emitter(s) 308 in this example include interior audio and visual emitters to communicate with passengers of the vehicle 302. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 308 in this example also include exterior emitters. By way of example and not limitation, the exterior emitters in this example include light emitters (e.g., indicator lights, signs, light arrays, etc.) to visually communicate with pedestrians, other drivers, other nearby vehicles, etc., one or more audio emitters (e.g., speakers, speaker arrays, horns, etc.) to audibly communicate with pedestrians, other drivers, other nearby vehicles, etc., etc. In at least one example, the emitter(s) 308 can be disposed at various locations about the exterior and/or interior of the vehicle 302.

The vehicle 302 can also include communication connection(s) 310 that enable communication between the vehicle 302 and other local or remote computing device(s). For instance, the communication connection(s) 310 can facilitate communication with other local computing device(s) on the vehicle 302 and/or the drive system(s) 314. Also, the communication connection(s) 310 can allow the vehicle to communicate with other nearby computing device(s) (e.g., other nearby vehicles, traffic signals, etc.). The communications connection(s) 310 also enable the vehicle 302 to communicate with a remote teleoperations computing device or other remote services.

The communications connection(s) 310 can include physical and/or logical interfaces for connecting the vehicle computing device(s) 304 to another computing device or a network, such as network(s) 332. For example, the communications connection(s) 310 can enable Wi-Fi-based communication such as via frequencies defined by the IEEE 802.11 standards, short range wireless frequencies such as BLUETOOTH®, or any suitable wired or wireless communications protocol that enables the respective computing device to interface with the other computing device(s).

The direct connection 312 can directly connect the drive system(s) 314 and other components of the vehicle 302.

In at least one example, the vehicle 302 can include drive system(s) 314. In some examples, the vehicle 302 can have a single drive system 314. In at least one example, if the vehicle 302 has multiple drive systems 314, individual drive systems 314 can be positioned on opposite ends of the vehicle 302 (e.g., the front and the rear, etc.). In at least one example, the drive system(s) 314 can include sensor system(s) to detect conditions of the drive system(s) 314 and/or the surroundings of the vehicle 302. By way of example and not limitation, the sensor system(s) can include wheel encoder(s) (e.g., rotary encoders) to sense rotation of the wheels of the drive module, inertial sensors (e.g., inertial measurement units, accelerometers, gyroscopes, magnetometers, etc.) to measure position and acceleration of the drive module, cameras or other image sensors, ultrasonic sensors to acoustically detect objects in the surroundings of the drive module, LIDAR sensors, RADAR sensors, etc. Some sensors, such as the wheel encoder(s), can be unique to the drive system(s) 314. In some cases, the sensor system(s) on the drive system(s) 314 can overlap or supplement corresponding systems of the vehicle 302 (e.g., sensor system(s) 306).

The drive system(s) 314 can include many of the vehicle systems, including a high voltage battery, a motor to propel the vehicle 302, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 314 can include a drive module controller which can receive and preprocess data from the sensor system(s) and to control operation of the various vehicle systems. In some examples, the drive module controller can include processor(s) and memory communicatively coupled with the processor(s). The memory can store one or more modules to perform various functionalities of the drive system(s) 314. Furthermore, the drive system(s) 314 also include communication connection(s) that enable communication by the respective drive module with other local or remote computing device(s).

In some examples, the vehicle computing device(s) 304, sensor system(s) 306, emitter(s) 308, and the communication connection(s) 310 can be implemented outside of an actual vehicle, for instance, as a simulated vehicle or as simulated systems, for use in "traversing" a simulated environment. That is, the vehicle computing device(s) 304, sensor system(s) 306, emitter(s) 308, and the communication connection(s) 310 can be used as a simulated autonomous vehicle for simulation purposes as described above.

As described above, the vehicle 302 can send sensor data to the computing device(s) 334, via the network(s) 332. That is, in some examples, the vehicle 302 can be a data collection device 102 as described above with reference to FIG. 1. For the purpose of this discussion, the computing device(s) described above with reference to FIG. 1 can refer to the vehicle computing device(s) 304 and/or the computing device(s) 334. In some examples, the vehicle 302 can send raw sensor data to the computing device(s) 334. In other examples, the vehicle 302 can send processed sensor data and/or representations of sensor data to the computing device(s) 334 (e.g., data output from the localization system 320, the perception system 322, the prediction system 324, and/or the planning system 326). In some examples, the vehicle 302 can send sensor data to the computing device(s) 334 at a particular frequency, after a lapse of a predetermined period of time, in near real-time, etc.

The computing device(s) 334 can receive the sensor data (raw or processed) from the vehicle 302 and/or one or more data collection devices 336 (which can include other vehicles like vehicle 302), as well as data from one or more third-party sources and/or systems 338. In at least one example, the computing device(s) 334 can include processor(s) 340 and memory 342 communicatively coupled with the processor(s) 340. In the illustrated example, the memory 342 of the computing device(s) 334 stores a simulation system 344, a training system 346, an evaluating system 348, a map(s) storage 350 (e.g., storing one or more maps, the road network data, the road mesh, etc.), a training data storage 352 (e.g., storing training data accessible to the training system 346), a model(s) storage 354 (e.g., models output by the training system 346), a stored object footprint(s) data storage 356, and a surface detail data storage 358. In some examples, one or more of the systems and/or storage repositories can be associated with the vehicle 302 instead of, or in addition to, being associated with the memory 342 of the computing device(s) 334.

The simulation system 344 can generate simulated environments. In at least one example, the simulation system 344 can generate simulated environments via procedural generation (e.g., creating data algorithmically), as described above with reference to FIGS. 1-2G. Additional details are also described below. In at least one example, the simulation system 344 can access the stored object footprint(s) data storage 356 and/or the surface detail data storage 358 to procedurally render simulated environments. In an example, the stored object footprint(s) data storage 356 can correspond to the stored object footprint(s) data storage 118 described above with reference to FIG. 1 and the surface detail data storage 358 can correspond to the surface detail data storage 130, as described above with reference to FIG. 1. In some examples, the stored object footprint(s) data storage 356 and/or the surface detail data storage 358 can be stored in the memory 342, as illustrated in FIG. 3. In additional or alternative examples, the stored object footprint(s) data storage 356 and/or the surface detail data storage 358 can be stored remotely and accessible to the computing device(s) 334 and/or data stored therein can be provided to the computing device(s) 334 from a third-party source and/or system 338. In some examples, stored object data and/or surface texture data can be generated in near-real time.

In at least one example, as described below, the simulation system 344 can procedurally render objects in simulated environments. That is, in some examples, the data described above (e.g., 3D tiles, road network data, supplemental data, etc.) still has deficiencies, when compared to a corresponding real environment. In such examples, the simulation system 344 can utilize various heuristics to render objects in the simulated environment. Non-limiting examples of such objects include lamp posts and/or poles for connecting the lamp post to a traffic signal, parking signs (e.g., which can be rendered based on parking lanes determined from the road network data), parking meters (e.g., which can be rendered based on parking lanes determined from the road network data), stop signs (e.g., which can be rendered based on stop lines determined from the road network data), etc. Additional details are described below with reference to FIG. 6.

In at least one example, the evaluating system 348 can evaluate how realistic a simulated environment, or a portion thereof, is relative to a corresponding real environment using the perception system 322 (or another system that inputs data into the perception system 322 (e.g., vision system, LIDAR system, etc.)). In some examples, two environments (e.g., real vs. simulated) can look different to a human, but can be perceived as the same to, for example, a robotic system (e.g., an autonomous vehicle) as defined herein (e.g., based on activations of a neural network). In at least one example, the evaluating system 348 can analyze the data using a machine-trained model to evaluate realism of a simulated environment. For instance, in at least one example, the evaluating system 348 can analyze a first intermediate output of a neural network associated with a system (e.g., a vision system, LIDAR system, etc.) (e.g., based on a simulated environment) with a second intermediate output of the neural network (e.g., based on a corresponding real environment), and can determine a similarity metric (e.g., a difference) that can be representative of how similar the neural network activations associated with the simulated environment are when compared to neural network activations associated with the corresponding real environment.

In at least some examples, such activations can be compared by discretizing a region of an input space into corresponding grids and building a histogram of activations in the associated grids for input data and comparison data. Once determined, the histograms may be analyzed, for example, by a support vector machine (SVM), wherein a distance (e.g., a statistical distance) is used to determine how similar the two data sets are. In some examples, different sensor data types can be associated with different parameters of interest (e.g., different parameters that are tuned to improve the realism of a simulated environment). For instance, with the vision system, the parameters of interest can be brightness, exposure, etc., and with the LIDAR system, the parameters of interest can be angles, distance, intensity, sensor modalities, etc.

In at least one example, the training system 346 can train a data model to learn which parameters matter for the perception system 322 (e.g., what parameters matter such that the perception system 322 can perceive the simulated environment as though it is perceiving the real environment). That is, in at least one example, the training system 346 can train a data model to evaluate realism based on one or more identified parameters. Additional details associated with training and/or using such model(s) are described in U.S. application Ser. No. 16/163,435, filed concurrently herewith on Oct. 17, 2018, the entire contents of which are incorporated by reference herein.

As described above, in at least one example, the evaluating system 348 can analyze data using a machine-trained model (e.g., as described above) to evaluate realism of a simulated environment. That is, the evaluating system 348 can analyze simulated environments to determine whether such simulated environments activate a neural network similarly to how corresponding real environments activate the neural network. In at least one example, the evaluating system 348 can utilize the machine-trained model to compare a first intermediate output associated with a real environment and a second intermediate output associated with a corresponding simulated environment to determine a similarity metric (e.g., a difference, a distance, etc.) representative of the similarity between the first intermediate output and the second intermediate output. In some examples, the first intermediate output and the second intermediate output can be derived from images, portions of data (e.g., that correspond to individual objects associated with the data), etc. For instance, in at least one example, the first intermediate output can be associated with a first perceived object in an image associated with the real environment and the second intermediate output can be associated with a second perceived object in an image associated with the simulated environment. If the similarity metric (e.g., the difference, the distance, etc.) does not meet a threshold (e.g., the first intermediate output and the second intermediate output are similar), the evaluating system 348 can determine that the simulated environment realistically represents the real environment (e.g., neural network activations are similar). However, if the similarity metric (e.g., the difference, the distance, etc.) meets or exceeds the threshold, the evaluating system 348 can tune one or more parameters to observe changes to the one or more metrics. For instance, the evaluating system 348 can tune parameters such as brightness, exposure, etc. for improving photorealism.

As described above, simulated environments can be useful for enhancing training, testing, and/or validating systems (e.g., one or more components of an AI stack) onboard an autonomous vehicle, such as vehicle 302. In at least one example, simulated environments can be useful for training data models where training data from real environments is insufficient (e.g., as is the case with rare objects, rare scenarios, etc.). In such examples, a resulting data model can be provisioned to, or accessible by, the vehicle 302, and the vehicle 302 can utilize the data model for classifying objects in real-time (e.g., while driving or otherwise operating in the real environment). That is, the perception system 322 can utilize the data model (trained based on simulated data associated with a simulated environment) onboard in near real-time to classify objects.

As a non-limiting example, training data from real environments is insufficient for training the vehicle 302 to recognize rare events/objects (e.g., traffic lights types that are not frequently seen). In at least one example, by comparing simulated environments with real environments, the data model can learn that particular parameters matter for training a traffic light classifier. For instance, such parameters can include bulb discoloration, shading, lens distortion, dirt on the light, a burnt-out filament, variation in brightness, bulb rotation, bulb intensity, etc. Based on identifying the parameters, the training system 346 can tune simulated environments associated with traffic lights and can train a traffic light classifier based on the tuned simulated environments. Such a classifier can be provisioned to, or accessible by, the vehicle 302, and the vehicle 302 can utilize the data model for classifying traffic lights in real-time. For instance, the perception system 322 can utilize the classifier (trained based on simulated data used to generate a simulated environment) onboard in near real-time to classify traffic lights. That is, as described above, in at least one example, a classifier can be trained on simulated data and used for evaluating real data. In some examples, the classifier can be trained on real data and validated using simulated data. In such examples, identified discrepancies can be used to improve the classifier. In at least some instances, such rare examples may be identified by training, for example, a traffic light detector based on simulated image data, running the detector on real data, and determining where detections were missed. Similarly, determining that simulated parameters are not correct may comprise training an algorithm (e.g. the same detector as above) on real data, running such a detector on simulated data, and detecting missed objects.

Furthermore, simulated environments can be useful for validating and/or updating a localization algorithm used by the localization system 320. For instance, in real environments, GPS sensors experience positional drifts and may, as a result, accumulate error. Accordingly, to validate a localization algorithm that is used for localizing the vehicle 302, the evaluating system 348 can use a simulated environment, where the pose of the vehicle 302 is known at various times (including at all times) and evaluate the sensor data associated with a corresponding real environment to validate the localization algorithm (e.g., by relying on simulated poses as position and/or orientation ground truth). In such an example, the sensor system(s) 306 can generate sensor data associated with the simulated environment and the sensor data can be analyzed by the perception system 322. An output of the perception system 322 (e.g., associated with a position in a real environment) can be validated in view of the sensor data associated with the corresponding position in the simulated environment. That is, the sensor data associated with a position in a simulated environment can serve as the ground truth for the corresponding position in the real environment. As an example, LIDAR data recorded in association with a simulated environment (e.g., where the pose of the vehicle 302 is known) can be compared to LIDAR data recorded in association with a corresponding position in a real environment and the localization algorithm can be updated as appropriate. Furthermore, simulated environments can be useful for validating RADAR or other sensors of the sensor system(s) 306. In some examples, simulated environments can offer ground truth data for calibrating sensors (e.g., of the sensor system(s) 106). Other examples include, but are not limited to validating rolling shutter in simulation, calibration (e.g., of one or more of intrinsics or extrinsics) of various sensors, and the like. As would be appreciated, the techniques described herein may be used in validation, calibration, training, etc. for various other systems, subsystems, etc.

The processor(s) 316 of the vehicle 302 and the processor(s) 340 of the computing device(s) 334 can be any suitable processor capable of executing instructions to process data and perform operations as described herein. By way of example and not limitation, the processor(s) 316 and 340 can comprise one or more Central Processing Units (CPUs), Graphics Processing Units (GPUs), or any other device or portion of a device that processes electronic data to transform that electronic data into other electronic data that can be stored in registers and/or memory. In some examples, associated circuits (e.g., ASICs, etc.), gate arrays (e.g., FPGAs, etc.), and other hardware devices can also be considered processors in so far as they are configured to implement encoded instructions.

Memory 318 and 342 are examples of non-transitory computer-readable media. Memory 318 and 342 can store an operating system and one or more software applications, instructions, programs, and/or data to implement the methods described herein and the functions attributed to the various systems. In various implementations, the memory can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 3 is illustrated as a distributed system, in alternative examples, components of the vehicle 302 can be associated with the computing device(s) 334 and/or components of the computing device(s) 334 can be associated with the vehicle 302. That is, the vehicle 302 can perform one or more of the functions associated with the computing device(s) 334, and vice versa.

Figure 4:
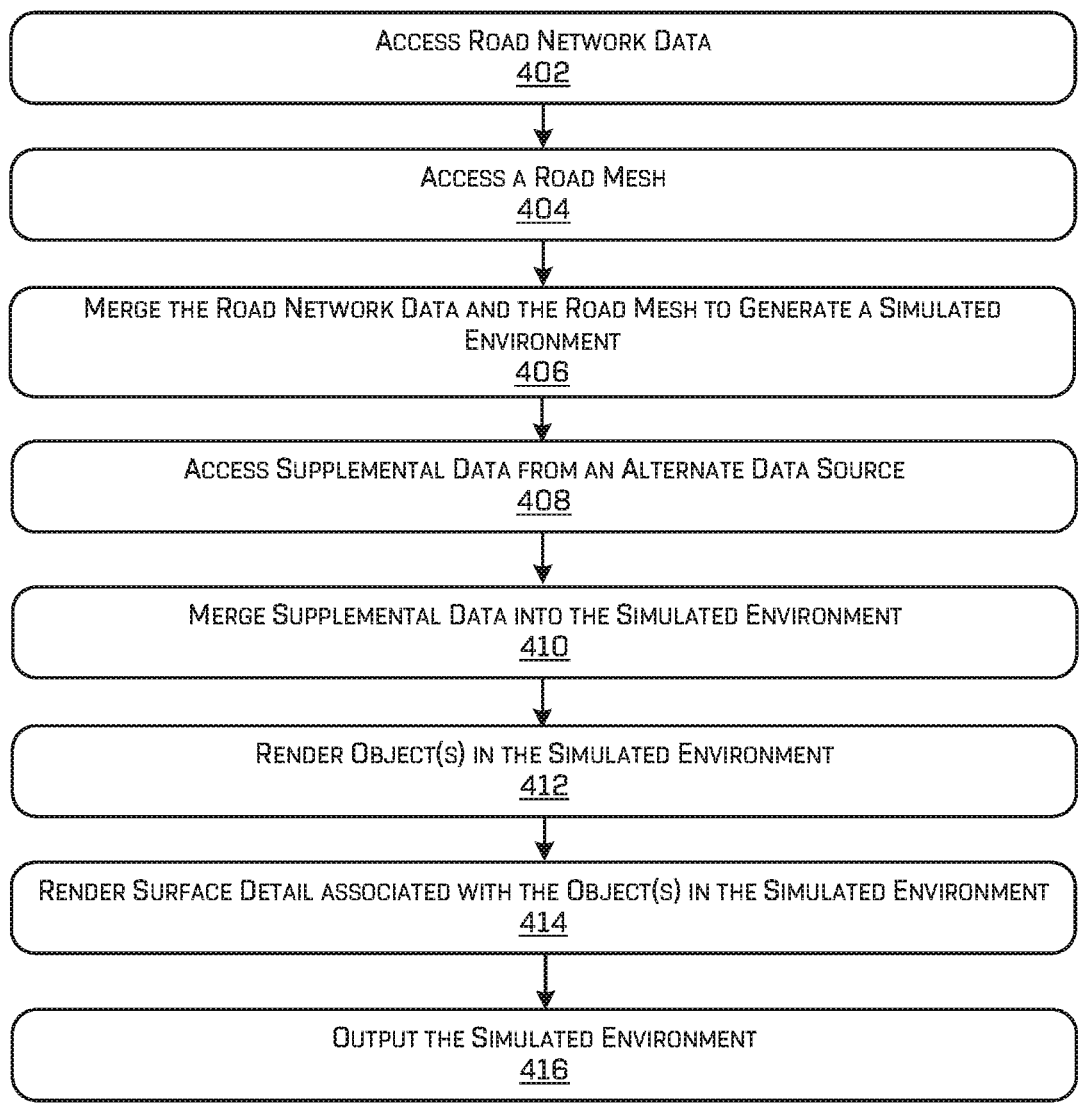
FIG. 4 illustrates an example process of procedurally rendering a simulated environment, as described herein.
Figure 5:
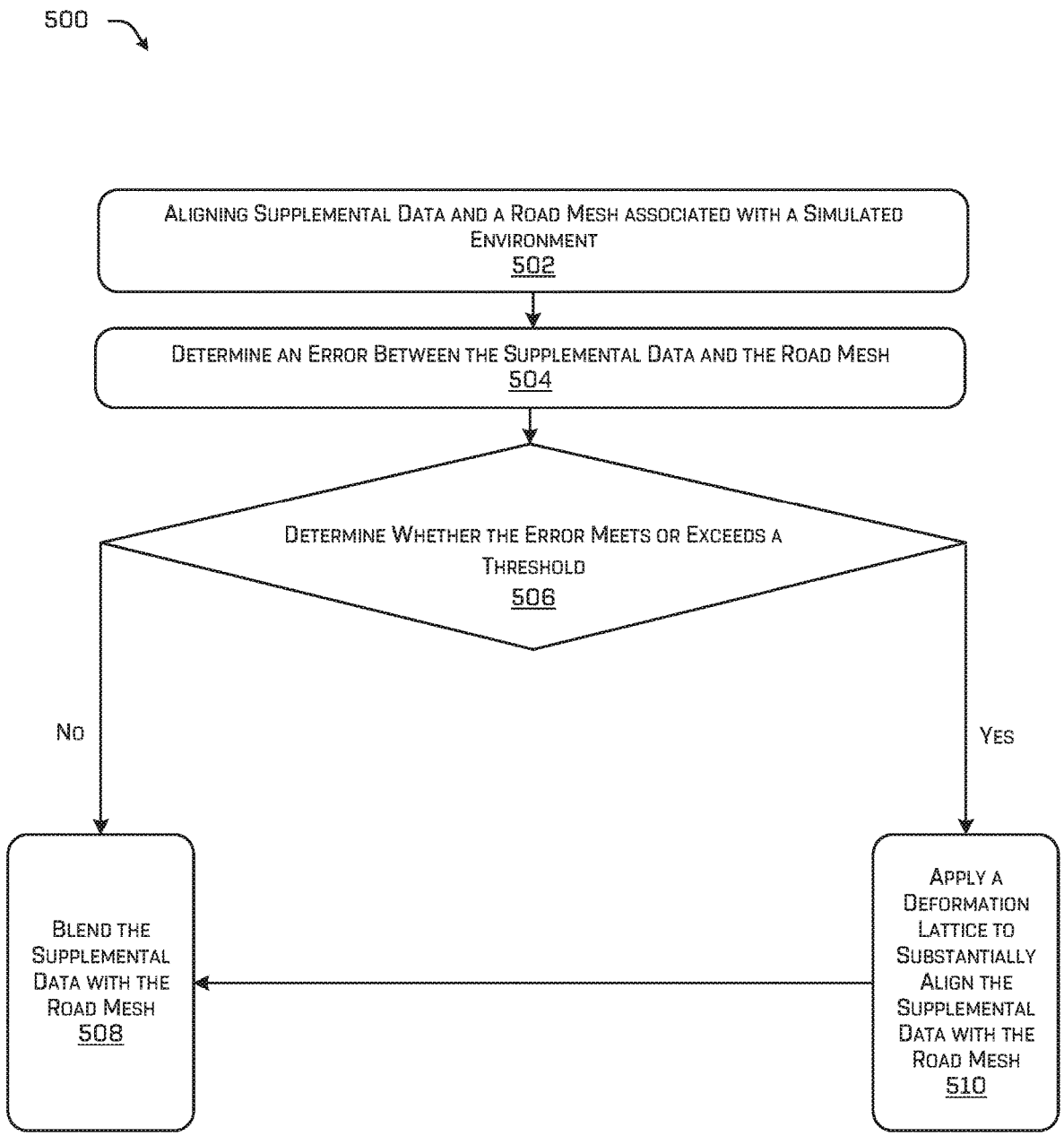
FIG. 5 illustrates an example process of integrating supplemental data with a road mesh, as described herein.
Figure 6:
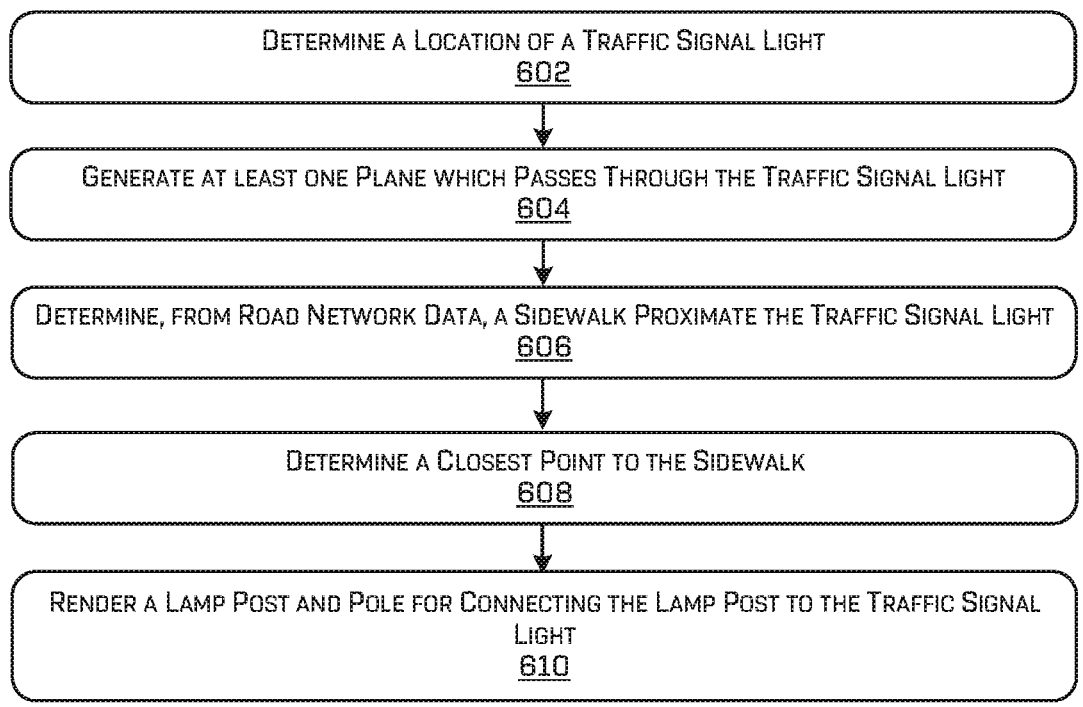
FIG. 6 illustrates an example process for rendering an object into a simulated environment, as described herein.

FIGS. 4-6 are flowcharts showing example methods involving techniques as described herein. The methods illustrated in FIGS. 4-6 are described with reference to the system 300 shown in FIG. 3 for convenience and ease of understanding. However, the methods illustrated in FIGS. 4-6 are not limited to being performed using the system 300. Moreover, the system 300 described herein is not limited to performing the methods illustrated in FIGS. 4-6.

The methods 400-600 are illustrated as collections of blocks in logical flow graphs, which represent sequences of operations that can be implemented in hardware, software, or a combination thereof. In the context of software, the blocks represent computer-executable instructions stored on one or more computer-readable storage media that, when executed by processor(s), perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes. In some embodiments, one or more blocks of the process can be omitted entirely. Moreover, the methods 400-600 can be combined in whole or in part with each other or with other methods.

FIG. 4 illustrates an example process 400 for generating a simulated environment and/or using the simulated environment for training, testing, validation, etc.

Block 402 illustrates accessing road network data. The vehicle computing device(s) 304 can receive, generate, and/or otherwise access road network data. In some examples, the road network data can be based at least in part on the sensor data. In at least one example, the road network data may, for example, be a 2D or 3D representation indicating one or more of a driving lane element, a bike lane element, a parking lane element, a crosswalk element, an intersection element, a lane divider element, a traffic light element, a stop sign element, a stop line element, a yield sign element, a yield line element, a driveway element, a speed bump element, jay walking regions (e.g., a virtual crosswalk), trajectory waypoints (e.g., known trajectories), passenger pickup points, a sign location element, a geofence element, and the like. In some examples, the road network data can be encoded with information indicating an attribute of a particular portion of the road network data, as described above. In at least one example, the simulation system 344 can access the road network data. As described above, in some examples, the road network data may be stored in the map(s) data storage 350.

Block 404 illustrates accessing a road mesh. In at least one example, the vehicle computing device(s) 304 can generate a road mesh 110. In at least one example, the vehicle computing device(s) 304 can receive LIDAR data, which can be used to generate a 3D point cloud representative of the real environment. In at least one example, the vehicle computing device(s) 304 can generate the road mesh 110 based on the 3D point cloud. The road mesh 110 can comprise 3D tiles, as described above. The simulation system 344 can access 3D tiles, which, in some examples, can be stored in the map(s) storage 350.

Block 406 illustrates merging the road network data and the road mesh to generate a simulated environment. The simulation system 344 can associate the road network data with the road mesh to generate a simulated environment. Such an association may comprise, in at least some instances, projecting the road network data (as 2D or 3D data) into the road mesh. This may be done by determining a middle of a road segment and substantially aligning the segment with corresponding regions from the road mesh upon projecting. Any outliers (e.g., surfaces which do not align with the road mesh after projection (e.g., a sidewalk projected into a tree due to errors in alignment or generation of the maps)) may be determined and smoothed as necessary. The resulting simulated environment can include accurate heights and surface details (e.g., in view of a corresponding real environment).

Block 408 illustrates accessing supplemental data from an alternate data source. In some examples, there may be holes in the simulated environment (e.g., incomplete data), for instance, due to occlusions (e.g., parked cars, tight alleyways, etc.) when constructing the road mesh. In at least one example, the simulation system 344 can access a second, alternate source of data to supplement the existing simulated environment (e.g., and fill in the holes). For instance, in at least one example, the simulation system 344 can access data from third-party source(s) and/or system(s) 338 and can leverage such data to supplement the existing simulated environment by merging the supplemental data into the simulated environment, as illustrated in block 410. In at least one example, the supplemental data can include USGS DEM data associated with the real environment, tree map data associated with the real environment, color imagery data associated with the real environment, map data associated with the environment, etc., as described above. In some examples, the supplemental data does not naturally align with the 3D tiles used for generating the simulated environments. Details associated with aligning the road mesh and the supplemental data are described below with reference to FIG. 5.

Block 412 illustrates rendering objects in the simulated environment. The simulation system 344 can leverage data associated with characteristics of objects in the environment to further supplement the simulated environment. In at least one example, the simulation system 344 can access data representative of footprints of buildings or other stationary objects, which can be stored in the stored object footprint(s) data storage 356. In some examples, such footprints can be associated with annotations regarding height, classification (e.g., residential, commercial, etc.), rule set(s) (e.g., for texturing), etc. The simulation system 344 can utilize the footprints and associated annotations as a guide mesh for generating façade pieces. In at least one example, the building footprints, heights, texturing, and classification may be randomly defined. In some examples, a predefined set of textures, heights, or footprints may be defined. A resulting set of random permutations of one or more of texture, height, footprint, etc. may, in turn, be used as the set of building with which to populate the simulated environment. In those examples where data associated with such footprints does not have an indication of positioning within a map (e.g., where footprints are randomly determined, retrieved from a data store of footprints agnostic to a map, etc.), such footprints may be aligned with, or otherwise positioned, such that at least one façade aligns with a street in a road network, is spaced according to one or more rules (e.g., placed a certain distance to a street and, based on the classification, a minimum or maximum distance from other buildings, is orientated in a particular orientation, etc.), and the like. When such rule sets are applied, plausible looking buildings can be generated automatically (e.g., without human modeling) to generate a simulated environment comprising buildings.

Block 414 illustrates rendering surface detail associated with object(s) in the simulated environment. In some examples, the simulation system 344 can utilize texturing data to add surface detail to the simulated environment, for instance, during real-time rendering. Such texturing adds details (e.g., defects, patches, markings, etc.) to objects in the simulated environment to make such objects appear unique (without increasing artist workload significantly). In at least one example, the simulation system 344 can utilize sparse virtual textures to render the simulated environment in a single draw which increases performances and reduces computational resources. In such an example, each surfel may be associated with unique data (such as an identification), such that the individual surfels may be allocated, addressed, and assigned. Furthermore, in some examples, the simulation system 344 can add a plurality of brushstroke-like decals on each surface of an object to be rendered in the simulated environment. In at least some examples, various decals may be applied for various regions and classifications of structures (e.g., photorealistic dirt and grime, graffiti, garbage, etc. may be applied to, for example, building façades in an alleyway) so as to modify any procedural based texturing (e.g., applying a pattern of textures over a surface given an associated classification).

In at least one example, the simulation system 344 can parameterize surfaces of a simulated environment to create unique texture coordinate spaces. In such an example, each surfel can be associated with a set of pixels that individually reference a texture, which can be stored in the surface detail data storage 358. Accordingly, at runtime, the simulation system 344 can utilize a single drawcall (e.g., to a shading system) that renders the detail (e.g., texture) associated with the portion of the simulated environment that can be seen via a viewport of a simulation computing device. In some examples, a simulated environment can be associated with more than one texture (e.g., associated with different properties of a material) and each texture can be rendered via an individual drawcall at runtime. Such techniques reduce workloads on the processor(s) 340, thereby offering computational efficiencies at runtime. In in least one example, if properties of the texture are changed, such changes can be stored in association with the texture in the surface detail data storage 358 and, at runtime, the changes can be reflected in the rendered texture. That is, a script can update the texture data associated with the texture in the surface detail data storage 358, thereby affecting an update to the texture as rendered in the simulated environment at runtime, without having to revisit all of the art.

Block 416 illustrates outputting the simulated environment. In at least one example, the simulation system 344 can output the simulated environment. As described above, simulated environments can be useful for enhancing training, testing, and/or validating systems (e.g., one or more components of an AI stack) onboard an autonomous vehicle, such as vehicle 302. In at least one example, simulated environments can be useful for training data models where training data from real environments is insufficient (e.g., as is the case with rare objects, rare scenarios, etc.). In such examples, a resulting data model can be provisioned to, or accessible by, the vehicle 302, and the vehicle 302 can utilize the data model for classifying objects in real-time (e.g., while driving or otherwise operating in the real environment). That is, the perception system 322 can utilize the data model (trained based on simulated data associated with a simulated environment) onboard in near real-time to classify objects. In at least some examples, such a data model trained using data associated with the simulated environment may output objects in a real environment based on real sensor data. A trajectory (and corresponding control) may then be determined for an autonomous vehicle to safely navigate the real environment, based at least in part on output of such data models trained on simulated data.

As described above, in at least one example, the evaluating system 348 can analyze perception data using a machine-trained model (e.g., as described above) to evaluate realism of a simulated environment. In at least one example, the evaluating system 348 can utilize the machine-trained model to compare a first intermediate output (e.g., associated with a layer of a neural network) associated with a real environment and a second intermediate output (e.g., associated with the same layer of the neural network) associated with a corresponding simulated environment to determine a similarity metric (e.g., a difference, a distance, etc.) representative of the similarity between the first intermediate output and the second intermediate output. In some examples, the first intermediate output and the second intermediate output can correspond to images, portions of data (e.g., that correspond to individual objects associated with the data), etc. If the similarity metric (e.g., the difference, the distance, etc.) does not meet a threshold (e.g., the first intermediate output and the second intermediate output are similar), the evaluating system 348 can determine that the simulated environment realistically represents the real environment and can output the simulated environment, as described above. However, if the similarity metric (e.g., the difference, the distance, etc.) meets or exceeds the threshold, the evaluating system 348 can tune one or more parameters to observe changes to the one or more metrics. For instance, the evaluating system 348 can tune parameters such as brightness, exposure, etc. for improving photorealism. When the similarity metric (e.g., the difference, the distance, etc.) is below the threshold (e.g., the first intermediate output and the second intermediate output are similar), the evaluating system 348 can determine that the simulated environment realistically represents the real environment.

FIG. 5 illustrates an example process 500 for merging supplemental data with the simulated environment.

Block 502 illustrates aligning supplemental data and a road mesh associated with a simulated environment. As described above, in some examples, the simulation system 344 can supplement the road mesh (e.g., 3D tiles) with the supplemental data. Initially, the simulation system 344 can coarsely align the supplemental data and the road mesh. The supplemental data may not naturally align with the 3D tiles of the road mesh used for generating the simulated environments.

Block 504 illustrates determining an error between the supplemental data and the road mesh associated with a simulated environment. In at least one example, the simulation system 344 can periodically measure error between the supplemental data and the road mesh. In at least one example, such measurements can be taken in areas where the supplemental data is expected to be accurate, such as, for example, large flat spaces (e.g., parking lots, large intersections, and the like). Such a space can correspond to a region of a real environment that meets or exceeds a threshold area (e.g., "large") and/or is associated with a maximum change in elevation across the region that is below a threshold (e.g., "flat"). In at least one example, such measurements can be taken in an area that is visible in the road mesh and the supplemental data and/or unobstructed and/or otherwise devoid of objects such as trees, buildings, etc. (e.g., for an aerial scan from USGS, etc.). In at least one example, the error can be measured from a designated position within the road mesh. In some examples, the designated position can be a centerline, which can be derived from the road network data and/or the road mesh. For instance, a center of the driving lines, as indicted in the road mesh, can be designated as the centerline from which the error can be measured. In at least some examples, the error can be measured from a center point determined of such a region. That is, the road mesh can be determined to be the authority and the error can be measured from the authority. As a non-limiting example, an error may be associated with differences (e.g., Euclidian distances) between the road mesh and the supplemental data. In some examples, the error can be a height error, measuring a vertical distance between the road mesh and the supplemental data. The error can be a single measurement, an average of multiple measurements, a maximum over an area, a minimum over an area, total error, or another statistically significant measurement representative of the difference and/or distance between the supplemental data and the road mesh.

Block 506 illustrates determining whether the error meets or exceeds a threshold. In at least one example, the simulation system 344 can compare the error to a threshold and, based on determining that the error does not meet or exceed the threshold, the simulation system 344 can perform blending techniques, such as, but not limited to global blending techniques, local blending techniques, linear blending techniques, smooth curve blending techniques (with a particular radius), etc., to blend the supplemental data with the road mesh, as illustrated in block 508. In at least one example, such blending techniques can involve decay such that error matters less and less as the simulation system 344 moves away from the selected area. That is, at the centerline of the road mesh, the error can be corrected or mitigated as described below, but other portions of the simulated environment that are successively farther away from the centerline can be blended to correct or otherwise mitigate the error.

Based on determining that the error meets or exceeds the threshold, the simulation system 344 can apply a deformation lattice to substantially align the supplemental data with the road mesh, as illustrated in block 510, prior to blending. Adjustments to either data of the third-party source or map from the mapping system may be made to drive such an error in the region(s) used for determining error (e.g., large, flat regions), and propagated throughout the remaining regions of the simulated environment. In at least one example, the simulation system 344 can make adjustments to the supplemental data such to locally align the supplemental data to the road mesh. In an additional or alternate example, the simulation system 344 can make adjustments to the road mesh such to locally align the road mesh with the supplemental data. For instance, in at least one example, the simulation system 344 can apply barycentric weighting to reduce the error (or other interpolations in the data). As a result, the simulation system 344 can output a refined simulated environment that, based on the supplemental data, is more complete than the simulated environment resulting from integrating the road network data and the road mesh. That is, holes in the simulated environment can be filled thereby enhancing the simulated environment with the supplemental data.

In some examples, flow may proceed first to block 508 from block 506. At block 508, deformations may be applied locally based on errors at large, flat, regions, such as intersections. An interpolation may be applied between errors from a first intersection (or region, etc.), to all neighboring intersections. In at least some examples, such interpolations may be linear, though all other interpolations are contemplated (e.g., polynomial, bicubic, etc.). For those regions of the road mesh that are away from the center points of such selected regions, barycentric coordinates (or some other bicubic, etc. interpolation) may be applied to adjust the road mesh to the supplemental data.

In those examples in which flow first proceeds to block 508, flow may then proceed to block 510. In such examples, despite adjusting the road mesh to the supplemental data, additional errors may be found between the mesh and the supplemental data. In such examples, block 510 may comprise further deforming (or otherwise adjusting one or more of the mesh or supplemental data). Such deformations may be performed in accordance with local deformations (e.g., where road mesh data comprises 100% of the source of height information at a center of the selected region and 0% of the height information past some radius from the center, following an S-curve, or otherwise). By locally deforming the data (either mesh or supplemental), it is possible to have smooth transitions between boundaries of mesh data and supplemental data.

FIG. 6 illustrates an example process 600 for procedurally rendering objects, such as a traffic lamp post, in a simulated environment, as described herein. In at least one example, the simulation system 344 can procedurally render objects in simulated environments. That is, in some examples, the data described above (e.g., 3D tiles, road network data, supplemental data, etc.) still has deficiencies, when compared to a corresponding real environment. In such examples, the simulation system 344 can utilize various heuristics to render objects in the simulated environment. Process 600 illustrates an example of such a process.

Block 602 illustrates determining a location of a traffic signal light in a simulated environment. In at least some examples, data about traffic signal light positions may be provided, or otherwise determined, for instance in association with the road network data and/or road mesh. In at least one example, the simulation system 344 can determine a location of a traffic signal light based on such data. However, such data may be devoid of traffic pole information.

Block 604 illustrates generating at least one plane which passes through the traffic signal light. In at least one example, the simulation system 344 can generate one or more planes which pass through the traffic signal light (e.g., at least a plane which has a surface normal pointing in the direction of illumination of the light source). In some examples, the simulation system 344 can generate two or more planes (e.g., a first plane that is parallel to the road under the traffic signal light and a second plane that is perpendicular to the road under the traffic light signal).

Block 606 illustrates determining, from road network data, a sidewalk proximate the traffic signal light. In at least one example, the simulation system 344 can identify a sidewalk proximate the traffic signal light, for instance based on the road network data described above.

Block 608 illustrates determining a closest point to the sidewalk. In at least one example, the simulation system 344 can determine the closest point to a surrounding sidewalk. Such a system may incorporate various path planning algorithms (e.g., A*, D*, etc., incorporate Manhattan constraints (enforcing 90-degree constraints), and/or minimize a number of bends of the light pole) in order to find the shortest path from the position of the traffic signal light to the closest sidewalk point.

Block 610 illustrates rendering a lamp post and pole for connecting the lamp post to the traffic signal light in the simulated environment. The simulation system 344 can utilize such determined path to render a lamp post, which can be associated with a pole for connecting the lamp post to the traffic signal light. In at least one example, the simulation system 344 can access data from the third-party source(s) and/or system(s) 338 which indicates rules for the position, orientation, style, etc. of the lamp post and pole. For instance, as a non-limiting example, such data can indicate that the lamp post should be positioned approximately 20 feet to the right of the traffic signal light.

While process 600 is directed to rendering a lamp post and pole for connecting the lamp post to a traffic signal, in additional or alternative examples, the process 600 can be directed to adding other objects into simulated environments. Non-limiting examples include parking signs (e.g., which can be rendered based on parking lanes determined from the road network data), parking meters (e.g., which can be rendered based on parking lanes determined from the road network data), stop signs (e.g., which can be rendered based on stop lines determined from the road network data), etc. In such examples, the simulation system 344 can access data from the third-party source(s) and/or system(s) 338 which indicates rules for the position, orientation, style, etc. of the objects. In at least one example, rendering such objects in simulated environment(s) can be parameterized such that the simulation system 344 can adhere to the rules as indicated by the third-party source(s) and/or system(s) 338.

Example Clauses

A. A computer-implemented method comprising: receiving sensor data from a plurality of data collection devices in a real environment; accessing a road network data associated with the real environment, the road network data associated with the real environment; generating, based at least in part on the sensor data, a road mesh associated with the real environment; integrating the road network data with the road mesh to generate a simulated environment; accessing a data storage of stored object footprints; selecting a stored object footprint from the data storage of the stored object footprints; rendering at least one object corresponding to the stored object footprint into the simulated environment; rendering a surface detail associated with the at least one object; and outputting the simulated environment for at least one of testing, validating, or training an algorithm used by an autonomous robotic computing device for at least one of navigating, planning, or decision making.

B. A computer-implemented method as paragraph A recites, wherein the road network data comprises a two-dimensional representation of the real environment and comprises at least one indication of a driving lane element, a bike lane element, a parking lane element, or a crosswalk element.

C. A computer-implemented method as any of paragraphs A-B recite, wherein the road mesh comprises a plurality of three-dimensional tiles output from a mapping system.

D. A computer-implemented method as any of paragraphs A-C recite, wherein integrating the road network data and the road mesh comprises: aligning a road segment in the road network data with a corresponding region of the road mesh; and projecting at least a portion of the road segment into the road mesh.

E. A computer-implemented method as any of paragraphs A-D recite, wherein the stored object footprint is associated with at least one annotation indicating a height, a classification, or a rule set indicating a texture associated with the object; and the computer-implemented further comprises rendering the at least one object corresponding to the stored object footprint into the simulated environment based at least in part on the annotation.

F. A computer-implemented method as any of paragraphs A-E recite, wherein the surface detail comprises at least one of a defect texture, a patch texture, or a marking texture.

G. A computer-implemented method as any of paragraphs A-F recite, wherein the surface detail is added using sparse virtual textures in a single draw.

H. A system comprising: at least one processor; and computer-readable instructions that, when executed by the at least one processor, cause the at least one processor to perform acts comprising: accessing road network data associated with a real environment; generating a road mesh associated with the real environment; associating the road network data with the road mesh to generate a simulated environment; procedurally rendering at least one object into the simulated environment based at least in part on at least one rule; and outputting the simulated environment for at least one of testing, validating, or training an algorithm used by an autonomous robotic computing device for controlling the autonomous robotic computing device.

I. The system as paragraph H recites, the acts further comprising: accessing a data storage comprising at least one stored object footprint; selecting a stored object footprint from the data storage; and rendering at least one object corresponding to the stored object footprint into the simulated environment based at least in part on the at least one rule.

J. The system as paragraph I recites, wherein the rule comprises an indication of a distance between an individual object and a street in the road network data, an indication of a distance between individual objects of a plurality of objects, or an orientation of individual objects of the plurality of objects.

K. The system as paragraph I recites, wherein the at least one stored object footprint is associated with an annotation indicating a characteristic of the object, the characteristic comprising a height or a classification.

L. The system as paragraph K recites, wherein the at least one stored object footprint is associated with a rule set for texturing the object, the rule set being associated with the at least one stored object footprint based on the characteristic.

M. The system as any of paragraphs H-L recite, the acts further comprising rendering surface detail associated with the at least one object using sparse virtual textures.

N. The system as any of paragraphs H-M recite, the acts further comprising: determining, based at least in part on the road network data, a location of a traffic signal light; generating at least one plane which passes through the traffic signal light; determining, from the road network data, a sidewalk proximate the traffic signal light; determining, using a planning algorithm, a closest point to the sidewalk; and rendering a lamp post and pole for connecting the lamp post to the traffic signal light in the simulated environment.

O. A non-transitory computer-readable medium storing instructions that, when executed, cause one or more processors to perform operations comprising: accessing road network data associated with a real environment; generating a road mesh associated with the real environment; integrating the road network data with the road mesh to generate a simulated environment; procedurally rendering at least one object into the simulated environment based at least in part on at least one rule; and outputting the simulated environment via a computing device.

P. The non-transitory computer-readable medium as paragraph O recites, wherein outputting the simulated environment comprises outputting the simulated environment via a simulation computing device for at least one of testing, validating, or training an algorithm used by an autonomous vehicle for controlling the autonomous vehicle; and the operations further comprise controlling the autonomous vehicle via the algorithm in the real environment.

Q. The non-transitory computer-readable medium as any of paragraphs O-P recites, the operations further comprising: accessing a data storage comprising at least one stored object footprint, the at least one stored object footprint being associated with at least one annotation indicating a height or a classification of a corresponding object; selecting a stored object footprint from the data storage; and rendering at least one object corresponding to the stored object footprint into the simulated environment based at least in part on an indication of a distance between an individual object and a street in the road network data, an indication of a distance between individual objects of a plurality of objects, or an indication of an orientation of individual objects of the plurality of objects.

R. The non-transitory computer-readable medium as paragraph Q recites, the operations further comprising: associating a rule set with the stored object footprint based at least in part on the at least one annotation; and rendering a texture in association with the object based at least in part on the rule set.

S. The non-transitory computer-readable medium as any of paragraphs O-R recite, the operations further comprising: accessing a data storage comprising a plurality of stored object footprints, wherein individual stored object footprints are associated with respective annotations; and combinatorially rendering one or more objects corresponding to one or more stored objects of the plurality of stored object footprints.

T. The non-transitory computer-readable medium as any of paragraphs O-S recite, the operations further comprising: determining, based at least in part on the road network data, a location of a traffic signal light; generating at least one plane which passes through the traffic signal light; determining, from the road network data, a sidewalk proximate the traffic signal light; determining, using a planning algorithm, a closest point to the sidewalk; and rendering a lamp post and pole for connecting the lamp post to the traffic signal light in the simulated environment.

U. A computer-implemented method comprising: receiving sensor data from a plurality of data collection devices in a real environment; accessing road network data associated with the real environment, the road network data based at least in part on the environment; determining, based at least in part on the sensor data, a road mesh associated with the real environment; associating the road network data with the road mesh to generate a simulated environment, wherein the simulated environment is incomplete with respect to the real environment; accessing supplemental data associated with the real environment, wherein the supplemental data provides information associated with the real environment that is unavailable to the plurality of data collection devices; associating the supplemental data with the simulated environment to supplement the simulated environment as a modified supplemental environment; and outputting the modified simulated environment for at least one of testing, validating, or training an algorithm used by an autonomous robotic computing device for at least one of navigating, planning, or decision making.

V. The computer-implemented method as paragraph U recites, wherein the supplemental data comprises a geospatial file format storing a raster-based digital elevation model.

W. The computer-implemented method as paragraph V recites, wherein the geospatial file format is associated with a United States Geological Survey (USGS) Data Evaluation Model (DEM) standard.

X. The computer-implemented method as any of paragraphs U-W recite, wherein the simulated environment is incomplete due to an occlusion in the sensor data associated with a parked car or an alleyway.

Y. The computer-implemented method as any of paragraphs U-X recite, further comprising: determining an error between a first portion of the supplemental data and second portion of the road mesh, the first portion and the second portion being associated with a same region of the real environment; determining that the error meets or exceeds a threshold amount of error; and adjusting at least one of the supplemental data or the road mesh to reduce the error.

Z. The computer-implemented method as paragraph Y recites, wherein the error comprises at least one of an average error associated with the same region of the real environment.

AA. The computer-implemented method as paragraph Y recites, further comprising applying a deformation lattice to one or more of at least a portion of the supplemental data or a corresponding portion of the road mesh to substantially align the supplemental data and the road mesh to reduce the error.

AB. A system comprising: at least one processor; and one or more computer-readable instructions that, when executed by the at least one processor, cause the at least one processor to perform acts comprising: receiving sensor data from at least one data collection device in a real environment; accessing at least one of road network data associated with the real environment or a road mesh associated with the real environment, the road mesh being associated with the sensor data; generating a simulated environment based on the at least one of the road network data or the road mesh; associating supplemental data with the simulated environment to generate a modified simulated environment; and outputting the modified simulated environment for at least one of testing, validating, or training an algorithm used by an autonomous robotic computing device for at least one of controlling the autonomous robotic computing device.

AC. The system as paragraph AB recites, wherein the simulated environment is incomplete due to at least one occlusion in the real environment.

AD. The system as any of paragraphs AB-AC recite, wherein the supplemental data provides information associated with the real environment that is otherwise unavailable to the at least one data collection device due to at least one occlusion.

AE. The system as any of paragraphs AB-AD recite, wherein the road network data comprises a two-dimensional representation of the real environment and comprises at least one indication of a driving lane element, a bike lane element, a parking lane element, or a crosswalk element.

AF. The system as any of paragraphs AB-AE recite, wherein the road mesh comprises a plurality of three-dimensional tiles output from a mapping system.

AG. The system as any of paragraphs AB-AF recite, wherein the operations further comprise accessing the road network data and the road mesh and associating the road network data and the road mesh based at least in part on projecting the road network data into the road mesh.

AH. The system as any of paragraphs AB-AG recite, wherein the supplemental data comprises elevation data collected by a third-party source or system.

AI. The system as any of paragraphs AB-AH recite, the acts further comprising: measuring a height error between a first portion of the supplemental data and second portion of the road mesh; determining that the height error meets or exceeds a threshold amount of error; and applying a deformation lattice to one or more of the first portion or the second portion to reduce the height error.

AJ. A non-transitory computer-readable medium storing instructions that, when executed, cause one or more processors to perform operations comprising: accessing at least one of road network data associated with a real environment or a road mesh associated with the real environment; generating a simulated environment based on the at least one of the road network data or the road mesh; associating supplemental data with the simulated environment to generate a modified simulated environment; and outputting the modified simulated environment for at least one of testing, validating, or training an algorithm used by an autonomous robotic computing device for at least one of controlling the autonomous robotic computing device AK. The non-transitory computer-readable medium as paragraph AJ recites, wherein the supplemental data comprises elevation data collected by a third-party source or system.

AL. The non-transitory computer-readable medium as any of paragraphs AJ-AK recite, wherein the supplemental data comprises a geospatial file format that is associated with a United States Geological Survey (USGS) Data Evaluation Model (DEM) standard.

AM. The non-transitory computer-readable medium as any of paragraphs AJ-AL recite, the operations further comprising: measuring a difference in height between a first portion of the supplemental data and second portion of the road mesh, the first portion and the second portion being associated with a same region of the real environment that is devoid of objects; determining that the difference meets or exceeds a threshold difference; and applying a deformation lattice to one or more of the first portion or the second portion to reduce the error.

AN. The non-transitory computer-readable medium as any of paragraphs AJ-AM recite, wherein the supplemental data provides information associated with the real environment that is otherwise unavailable to the at least one data collection device due to at least one occlusion.

While the example clauses described above are described with respect to one particular implementation, it should be understood that, in the context of this document, the content of the example clauses can also be implemented via a method, device, system, a computer-readable medium, and/or another implementation.

Conclusion

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A computer-implemented method comprising:
receiving sensor data from a plurality of data collection devices in a real environment;
accessing a road network data associated with the real environment, the road network data associated with the real environment;
generating, based at least in part on the sensor data, a road mesh associated with the real environment;
integrating the road network data with the road mesh to generate a simulated environment, the integrating comprising:
aligning a road segment in the road network data with a corresponding region of the road mesh; and
projecting at least a portion of the road segment into the road mesh;
accessing a data storage of stored object footprints;
selecting a stored object footprint from the data storage of the stored object footprints;
rendering at least one object corresponding to the stored object footprint into the simulated environment;
rendering a surface detail associated with the at least one object; and
outputting the simulated environment for at least one of testing, validating, or training an algorithm used by an autonomous robotic computing device for at least one of navigating, planning, or decision making.

2. The computer-implemented method as claim 1 recites, wherein the road network data comprises a two-dimensional representation of the real environment and comprises at least one indication of a driving lane element, a bike lane element, a parking lane element, or a crosswalk element.

3. The computer-implemented method as claim 1 recites, wherein the road mesh comprises a plurality of three-dimensional tiles output from a mapping system.

4. The computer-implemented method as claim 1 recites, wherein the stored object footprint is associated with at least one annotation indicating a height, a classification, or a rule set indicating a texture associated with the object; and
the computer-implemented method further comprises rendering the at least one object corresponding to the stored object footprint into the simulated environment based at least in part on the annotation.

5. The computer-implemented method as claim 1 recites, wherein the surface detail comprises at least one of a defect texture, a patch texture, or a marking texture.

6. The computer-implemented method as claim 1 recites, wherein the surface detail is added using sparse virtual textures in a single draw.

7. A system comprising:
at least one processor; and
computer-readable instructions that, when executed by the at least one processor, cause the at least one processor to perform acts comprising:
receiving sensor data associated with a sensor;
accessing road network data associated with a real environment;
generating, based at least in part on the sensor data, a road mesh associated with the real environment;
aligning a road segment in the road network data with a corresponding region of the road mesh;
projecting at least a portion of the road segment into the road mesh;
generating a simulated environment based at least in part on the aligning and the projecting;
procedurally rendering at least one object into the simulated environment based at least in part on at least one rule;
rendering a surface detail associated with the at least one object; and
outputting the simulated environment for at least one of testing, validating, or training an algorithm used by an autonomous robotic computing device for controlling the autonomous robotic computing device.

8. The system as claim 7 recites, the acts further comprising:
accessing a data storage comprising at least one stored object footprint;
selecting a stored object footprint from the data storage; and
rendering at least one object corresponding to the stored object footprint into the simulated environment based at least in part on the at least one rule.

9. The system as claim 8 recites, wherein the rule comprises an indication of a distance between an individual object and a street in the road network data, an indication of a distance between individual objects of a plurality of objects, or an orientation of individual objects of the plurality of objects.

10. The system as claim 8 recites, wherein the at least one stored object footprint is associated with an annotation indicating a characteristic of the object, the characteristic comprising a height or a classification.

11. The system as claim 10 recites, wherein the at least one stored object footprint is associated with a rule set for texturing the object, the rule set being associated with the at least one stored object footprint based at least in part on the characteristic.

12. The system as claim 7 recites, the acts further comprising rendering the surface detail associated with the at least one object based at least in part on sparse virtual textures.

13. The system as claim 7 recites, the acts further comprising:
determining, based at least in part on the road network data, a location of a traffic signal light;
generating at least one plane which passes through the traffic signal light;
determining, from the road network data, a sidewalk proximate the traffic signal light;
determining, using a planning algorithm, a closest point to the sidewalk; and
rendering a lamp post and pole for connecting the lamp post to the traffic signal light in the simulated environment.

14. A non-transitory computer-readable medium storing instructions that, when executed, cause one or more processors to perform operations comprising:
receiving sensor data associated with a sensor;
accessing road network data associated with a real environment;
generating, based at least in part on the sensor data, a road mesh associated with the real environment;
integrating the road network data with the road mesh to generate a simulated environment, the integrating comprising:
aligning a road segment in the road network data with a corresponding region of the road mesh; and
projecting at least a portion of the road segment into the road mesh;
procedurally rendering at least one object into the simulated environment based at least in part on at least one rule;
rendering a surface detail associated with the at least one object; and
outputting the simulated environment via a computing device.

15. The non-transitory computer-readable medium as claim 14 recites, wherein outputting the simulated environment comprises outputting the simulated environment via a simulation computing device for at least one of testing, validating, or training an algorithm used by an autonomous vehicle for controlling the autonomous vehicle; and
the operations further comprise controlling the autonomous vehicle via the algorithm in the real environment.

16. The non-transitory computer-readable medium as claim 14 recites, the operations further comprising:
accessing a data storage comprising at least one stored object footprint, the at least one stored object footprint being associated with at least one annotation indicating a height or a classification of a corresponding object;
selecting a stored object footprint from the data storage; and
rendering at least one object corresponding to the stored object footprint into the simulated environment based at least in part on an indication of a distance between an individual object and a street in the road network data, an indication of a distance between individual objects of a plurality of objects, or an indication of an orientation of individual objects of the plurality of objects.

17. The non-transitory computer-readable medium as claim 16 recites, the operations further comprising:
associating a rule set with the stored object footprint based at least in part on the at least one annotation; and
rendering a texture in association with the object based at least in part on the rule set.

18. The non-transitory computer-readable medium as claim 14 recites, the operations further comprising:
accessing a data storage comprising a plurality of stored object footprints, wherein individual stored object footprints are associated with respective annotations; and
combinatorially rendering one or more objects corresponding to one or more stored objects of the plurality of stored object footprints.

19. The non-transitory computer-readable medium as claim 15 recites, the operations further comprising:
determining, based at least in part on the road network data, a location of a traffic signal light;
generating at least one plane which passes through the traffic signal light;
determining, from the road network data, a sidewalk proximate the traffic signal light;
determining, using a planning algorithm, a closest point to the sidewalk; and
rendering a lamp post and pole for connecting the lamp post to the traffic signal light in the simulated environment.

20. The non-transitory computer-readable medium as claim 14 recites, wherein the road network data comprises a two-dimensional representation of the real environment and comprises at least one indication of a driving lane element, a bike lane element, a parking lane element, or a crosswalk element.

* * * * *